United States Patent
Yeh et al.

(10) Patent No.: US 11,449,453 B2
(45) Date of Patent: Sep. 20, 2022

(54) MULTI-PACKAGE SYSTEM USING CONFIGURABLE INPUT/OUTPUT INTERFACE CIRCUITS FOR SINGLE-ENDED INTRA-PACKAGE COMMUNICATION AND DIFFERENTIAL INTER-PACKAGE COMMUNICATION

(71) Applicant: MEDIATEK INC., Hsin-Chu (TW)

(72) Inventors: Chun-Yuan Yeh, Hsinchu (TW);
Yan-Bin Luo, Hsinchu (TW);
Tse-Hsiang Hsu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/165,898

(22) Filed: Feb. 2, 2021

(65) Prior Publication Data

US 2021/0326292 A1 Oct. 21, 2021

Related U.S. Application Data

(60) Provisional application No. 63/010,714, filed on Apr. 16, 2020.

(51) Int. Cl.
*G06F 15/78* (2006.01)
*G06F 11/07* (2006.01)
(Continued)

(52) U.S. Cl.
CPC .......... *G06F 13/4068* (2013.01); *G06F 13/20* (2013.01); *G06F 13/4208* (2013.01); *G06F 13/4291* (2013.01); *H01L 25/0655* (2013.01)

(58) Field of Classification Search
None
See application file for complete search history.

(56) References Cited

U.S. PATENT DOCUMENTS 8,233,303 B2 7/2012 Best
8,520,400 B2 8/2013 Rofougaran
(Continued)

FOREIGN PATENT DOCUMENTS

CN 102414985 A 4/2012
CN 102908137 A 2/2013
(Continued)

OTHER PUBLICATIONS

Erett, A 126mW 56Gb/s NRZ Wireline Transceiver for Synchronous Short-Reach Applications in 16nm FinFET, ISSCC 2018 / SESSION 16 / Advanced Optical and Wireline Techniques /16.7, pp. 274-275 and a page including Figure 16.7.7.
(Continued)

*Primary Examiner* — Hyun Nam
(74) *Attorney, Agent, or Firm* — Winston Hsu

(57) ABSTRACT

A multi-package system includes a first semiconductor package and a second semiconductor package. The first semiconductor package includes a first die and a second die. The second semiconductor package includes a third die. A first processing circuit of the first die communicates with a second processing circuit of the second die through a first configurable input/output (IO) interface circuit of the first die and a third configurable IO interface circuit of the second die that are configured to perform single-ended intra-package communication. The first processing circuit of the first die communicates with a third processing circuit of the third die through a second configurable IO interface circuit of the first die and a fourth configurable IO interface circuit of the third die that are configured to perform differential inter-package communication. The first configurable IO interface circuit and the second configurable IO interface circuit have a same circuit design.

20 Claims, 24 Drawing Sheets

(51) Int. Cl.
*G06F 13/40* (2006.01)
*G06F 13/20* (2006.01)
*G06F 13/42* (2006.01)
*H01L 25/065* (2006.01)

(56) References Cited

U.S. PATENT DOCUMENTS

| | | |
|---|---|---|
| 9,160,346 B2 | 10/2015 | Khawshe |
| 9,536,863 B2 | 1/2017 | Hinck |
| 2002/0108006 A1* | 8/2002 | Snyder ................ G06F 13/4068 710/100 |
| 2003/0154357 A1* | 8/2003 | Master ................ G06F 15/7867 712/15 |
| 2004/0114622 A1* | 6/2004 | Nation .................... H04L 69/12 370/465 |
| 2005/0208838 A1* | 9/2005 | Horowitz ................ H04B 3/32 439/676 |
| 2006/0001163 A1 | 1/2006 | Kolbehdari |
| 2013/0021060 A1* | 1/2013 | Or-Bach ............... H01L 23/544 438/129 |
| 2015/0269109 A1* | 9/2015 | Spry ................... G06F 13/4265 710/105 |
| 2015/0278141 A1* | 10/2015 | Galibois ............. G06F 9/44505 703/8 |
| 2016/0019183 A1 | 1/2016 | Thurston |
| 2016/0226651 A1 | 8/2016 | Kim |
| 2018/0210857 A1 | 7/2018 | Spry |
| 2018/0315569 A1* | 11/2018 | Hoffmann ............. H01H 50/14 |
| 2019/0042505 A1 | 2/2019 | Subbareddy |
| 2019/0361831 A1 | 11/2019 | Schulz |
| 2020/0041565 A1 | 2/2020 | Aga |
| 2020/0042471 A1 | 2/2020 | Kerr |
| 2020/0372273 A1* | 11/2020 | Temerowski, II .......................... G06K 9/00926 |

FOREIGN PATENT DOCUMENTS

| | | |
|---|---|---|
| CN | 103988140 A | 8/2014 |
| TW | 201225101 A1 | 6/2012 |
| WO | 02/29581 A2 | 4/2002 |
| WO | 02/029581 A3 | 4/2003 |
| WO | 2013/095561 A1 | 6/2013 |

OTHER PUBLICATIONS

Poulton, A 1.17-pJ/b, 25-GB/s/pin Ground-Referenced Single-Ended Serial Link for Off- and On-Package Communication Using a Process- and Temperature-Adaptive Voltage Regulator, IEEE Journal of Solid-State Circuits, vol. 54, No. 1, pp. 43-54, Jan. 2019.

* cited by examiner

MULTI-PACKAGE SYSTEM USING CONFIGURABLE INPUT/OUTPUT INTERFACE CIRCUITS FOR SINGLE-ENDED INTRA-PACKAGE COMMUNICATION AND DIFFERENTIAL INTER-PACKAGE COMMUNICATION

CROSS REFERENCE TO RELATED APPLICATIONS

This application claims the benefit of U.S. provisional application No. 63/010,714, filed on Apr. 16, 2020 and incorporated herein by reference.

BACKGROUND

The present invention relates to an integrated circuit design, and more particularly, to a multi-package system using configurable input/output interface circuits for single-ended intra-package communication and differential inter-package communication.

The electronics industry is experiencing a renaissance in semiconductor package technology. A growing number of package assembly methodologies have evolved to enable the electronics industry to maximize their product functionality. By integrating multiple dice within a single package, the printed circuit board can be made significantly smaller, and shorter interconnects resulting from such integration can contribute to improvement of both electrical performance and functional capability. Since multiple dice may be integrated in a same package (chip) and a system may have multiple packages (chips) mounted on a same printed circuit board, there is a need for an innovative die-to-die input/output (IO) interface design for intra-package communication and an innovative chip-to-chip IO interface design for inter-package communication.

SUMMARY

One of the objectives of the claimed invention is to provide a multi-package system using configurable input/output interface circuits for single-ended intra-package communication and differential inter-package communication.

According to a first aspect of the present invention, an exemplary multi-package system is disclosed. The exemplary multi-package system includes a first semiconductor package and a second semiconductor package. The first semiconductor package includes a first die and a second die. The first die includes a first processing circuit arranged to perform designated functions, a first configurable input/output (IO) interface circuit; and a second configurable IO interface circuit. The second die includes a second processing circuit arranged to perform designated functions, and a third configurable IO interface circuit coupled to the first configurable IO circuit via intra-package traces. The second semiconductor package includes a third die. The third die includes a third processing circuit arranged to perform designated functions, and a fourth configurable IO interface circuit coupled to the second configurable IO interface circuit via inter-package traces. The first processing circuit communicates with the second processing circuit through the first configurable IO interface circuit and the third configurable IO interface circuit that are configured to perform single-ended intra-package communication. The first processing circuit communicates with the third processing circuit through the second configurable IO interface circuit and the fourth configurable IO interface circuit that are configured to perform differential inter-package communication. The first configurable IO interface circuit and the second configurable IO interface circuit have a same circuit design.

According to a second aspect of the present invention, an exemplary die packaged in a semiconductor package is disclosed. The exemplary die includes a processing circuit arranged to perform designated functions, and a configurable input/output (IO) interface circuit. When the configurable IO interface circuit is coupled to another die in the semiconductor package via intra-package traces, the configurable IO interface circuit is configured to provide single-ended intra-package communication for the processing circuit. When the configurable IO interface circuit is coupled to another die in another semiconductor package via inter-package traces, the configurable IO interface circuit is configured to provide differential inter-package communication for the processing circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
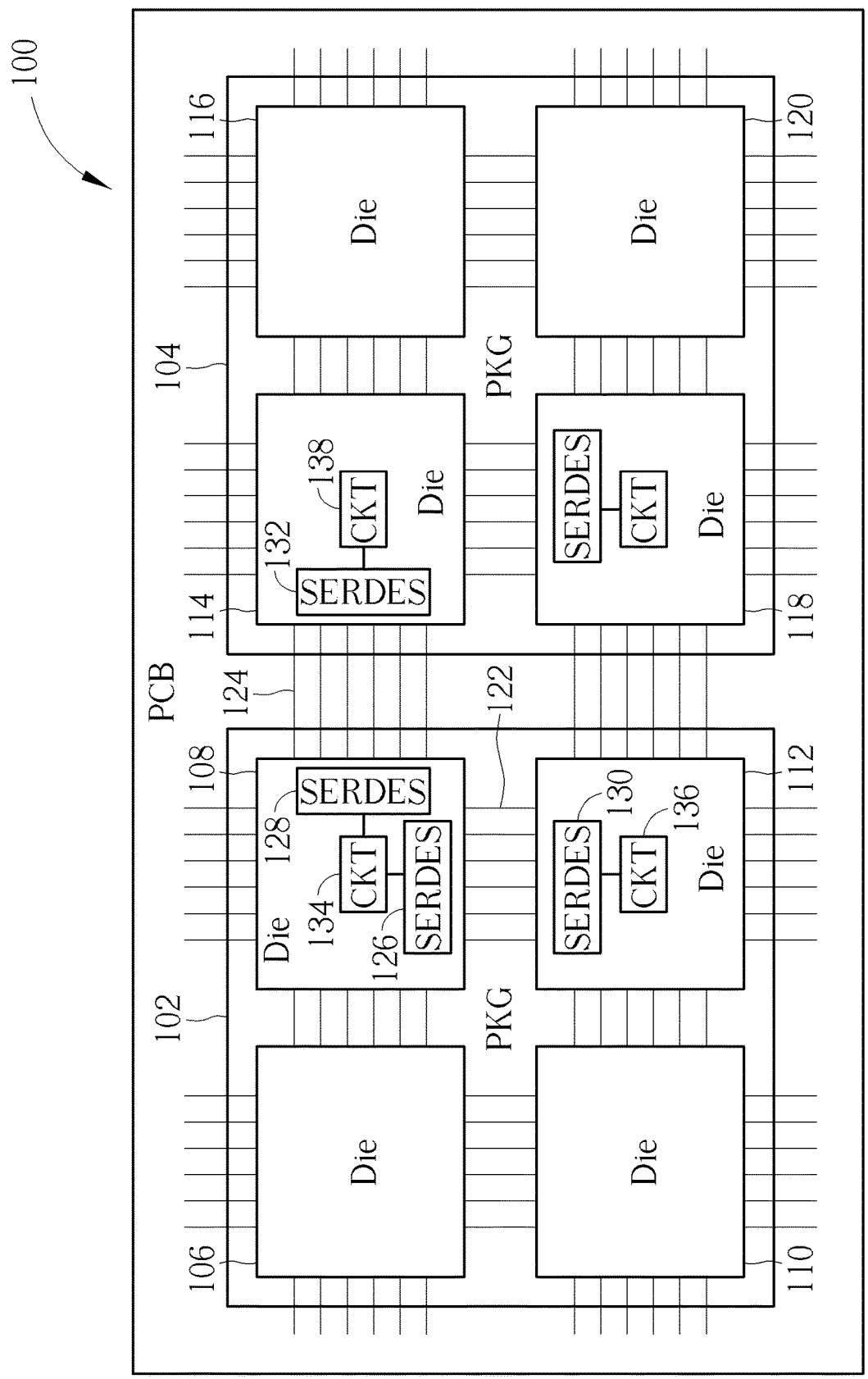
FIG. 1 is a diagram illustrating a multi-package system according to an embodiment of the present invention.

FIG. 1 is a diagram illustrating a multi-package system according to an embodiment of the present invention. The multi-package system 100 includes a plurality of semiconductor packages (e.g., 102 and 104) mounted on a printed circuit board (PCB) 101. A semiconductor package may also be referred to as a semiconductor chip. In the following, the terms "package" and "chip" may be interchangeable. Each of the semiconductor packages (labeled by "PKG") 102 and 104 includes a plurality of dice packaged therein. In this embodiment, four dice 106, 108, 110, and 112 are packaged in the same semiconductor package 102, and four dice 114, 116, 118, and 120 are packaged in the same semiconductor package 104. It should be noted that the number of semiconductor packages mounted on one PCB and the number of dice packaged in one semiconductor package may be adjusted, depending upon actual design considerations. In addition, regarding the multi-package system 100, the semiconductor packages may be homogeneous chips (i.e., identical chips) or heterogeneous chips (i.e., difference chips), where multiple dice packaged in the same semiconductor package may be homogeneous dice (i.e., identical dice) or heterogeneous dice (i.e., different dice). For example, the multi-package system 100 may be employed by a data center or an artificial intelligence (AI) application, and may have homogeneous chips, where each of the homogeneous chips may have multiple dice, and each die may employ proposed configurable input/output interface circuit(s) for single-ended intra-package (die-to-die) communication and/or differential inter-package (chip-to-chip) communication.

As shown in FIG. 1, one die in a semiconductor package communicates with another die in the same semiconductor package via intra-package communication. For example, the intra-package communication between dice 108 and 112 is achieved through PKG traces (i.e., intra-package traces) 122 routed inside the semiconductor package 102. Furthermore, one die in a semiconductor package communicates with another die in a different semiconductor package via inter-package communication. For example, the inter-package communication between dice 108 and 114 is achieved through PCB traces (i.e., inter-package traces) 124 between the semiconductor packages 102 and 104.

The input/output (IO) specification for intra-package communication may include several requirements. For example, the throughput efficiency is required to be ~1 Tbps/mm, the energy efficiency is required to be 1 pJ/bit-0.5 pJ/bit, the package trace length is required to be 10 mm-50 mm, and the bit error rate (BER) is required to be lower than 1E-15. In addition, the silicon area per IO port should be small for dense integration, and the analog/complex circuitry should be minimized to offer easy/fast process porting. Hence, single-ended circuitry may be employed to realize the intra-package communication for meeting the above-mentioned requirements.

Figure 2:
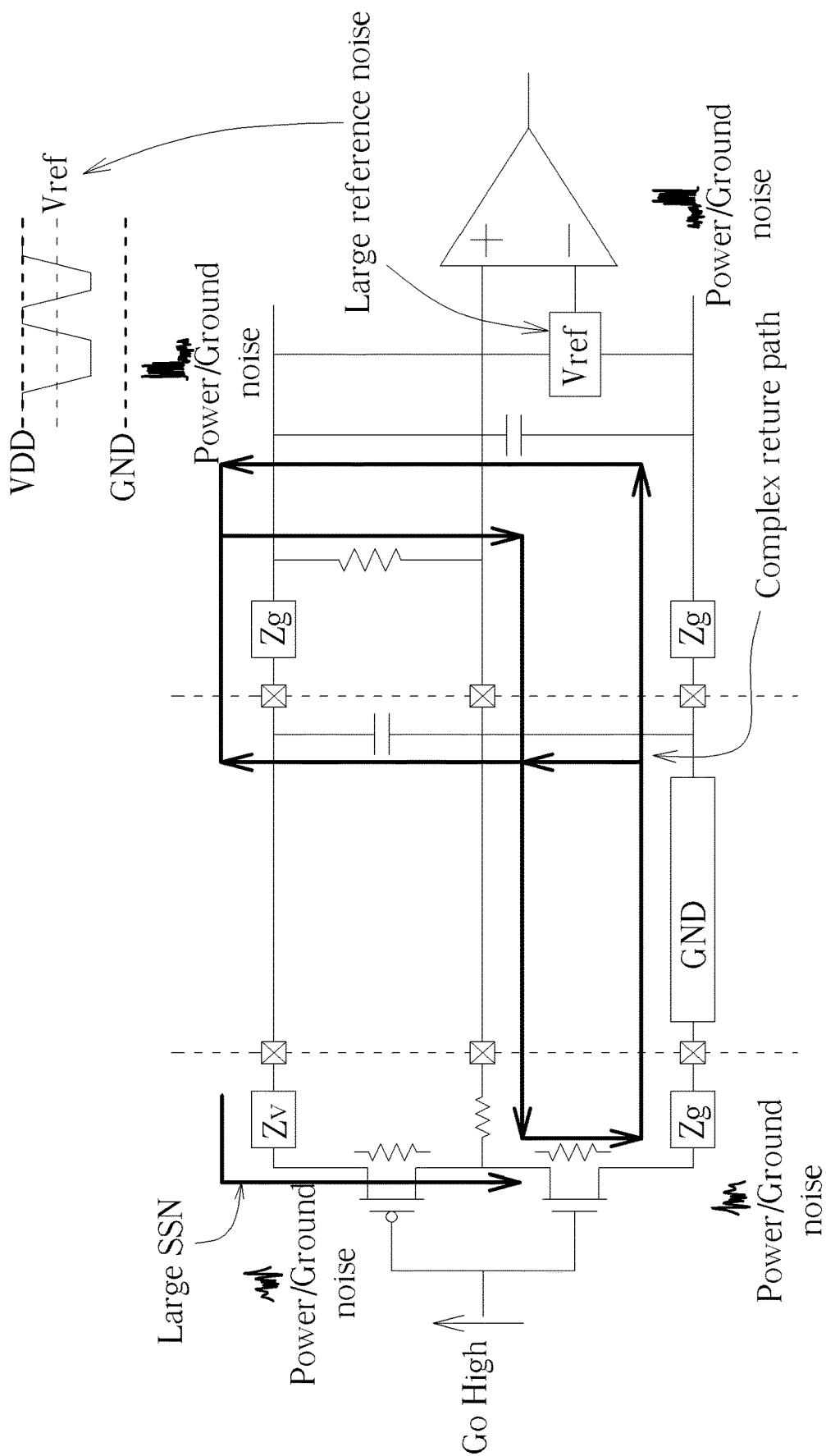
FIG. 2 is a diagram illustrating problems encountered by single-ended signaling used in inter-package communication.

However, when the single-ended circuitry is employed to realize the inter-package communication, the single-ended circuitry will suffer from larger crosstalk via coupling from traces and power/ground return path, worse termination from complex return path, larger simultaneous switching noise (SSN), and larger reference noise between a transmitter (TX) and a receiver (RX). FIG. 2 is a diagram illustrating problems encountered by single-ended signaling used in inter-package communication. The reference noise is large due to the fact that it is hard to get TX and RX to agree on the reference voltage Vref. The return path is complex due to the fact that the return current must split and flow through both the power supply and the ground network, which leads to poor termination and large crosstalk. The SSN is large due to the fact that data-dependent current generates noise on the power supply, and the noise is coupled to other signals via the power supply.

In contrast to the single-ended circuitry, the differential circuitry has better signal integrity (SI)/power integrity (PI) performance due to smaller crosstalk resulting from inherent common-mode rejection ratio (CMRR) and well defined return path, better termination resulting from well defined return path, less SSN resulting from differential circuit operation, and no reference noise issue. When crosstalk/reflection/SSN/reference noise in the single-ended circuitry is considered, the differential circuitry may be selected for realizing the inter-package communication.

If one die is designed to have one dedicated single-ended IO interface and one dedicated differential IO interface both located along one die edge, the dedicated single-ended IO interface is redundant when no intra-package communication is needed at the die edge, and the dedicated differential IO interface is redundant when no inter-package communication is needed at the die edge. Besides, implementation of the dedicated single-ended IO interface and implementation of the dedicated differential IO interface may require different silicon intellectual property (SIP) blocks/cores, that is, different circuit designs. To address above issues, the present invention proposes using a configurable input/output (IO) interface circuit (e.g., a configurable Serializer/Deserializer (SERDES) IO interface circuit) that can be configured as a single-ended die-to-die IO interface circuit for intra-package communication or a differential chip-to-chip IO interface circuit for inter-package communication.

As shown in FIG. 1, a configurable IO interface circuit (labeled by "SERDES") 126 of the die 108 and a configurable IO interface circuit (labeled by "SERDES") 130 of the die 112 are both configured as single-ended IO interface circuits to enable intra-package communication between a processing circuit (labeled by "CKT") 134 of the die 108 and a processing circuit (labeled by "CKT") 136 of the die 112, where the processing circuit 134 is arranged to perform designated functions of the die 108, and the processing circuit 134 is arranged to perform designated functions of the die 112. Furthermore, a configurable IO interface circuit (labeled by "SERDES") 128 of the die 108 and a configurable IO interface circuit (labeled by "SERDES") 132 of the die 114 are both configured as differential IO interface circuits to enable inter-package communication between the processing circuit (labeled by "CKT") 134 of the die 108 and a processing circuit (labeled by "CKT") 138 of the die 114, where the processing circuit 138 is arranged to perform designated functions of the die 114. It should be noted that, all configurable IO interface circuits in the same die may have the same circuit design (e.g., same SIP block/core), or all configurable IO interface circuits in the same package may have the same circuit design (e.g., same SIP block/core), or all configurable IO interface circuits in the same multi-package system may have the same circuit design (e.g., same SIP block/core). The same circuit design employed by configurable IO interface circuits may be divided into a TX design and an RX design for achieving SERDES IO functionality.

Figure 3:
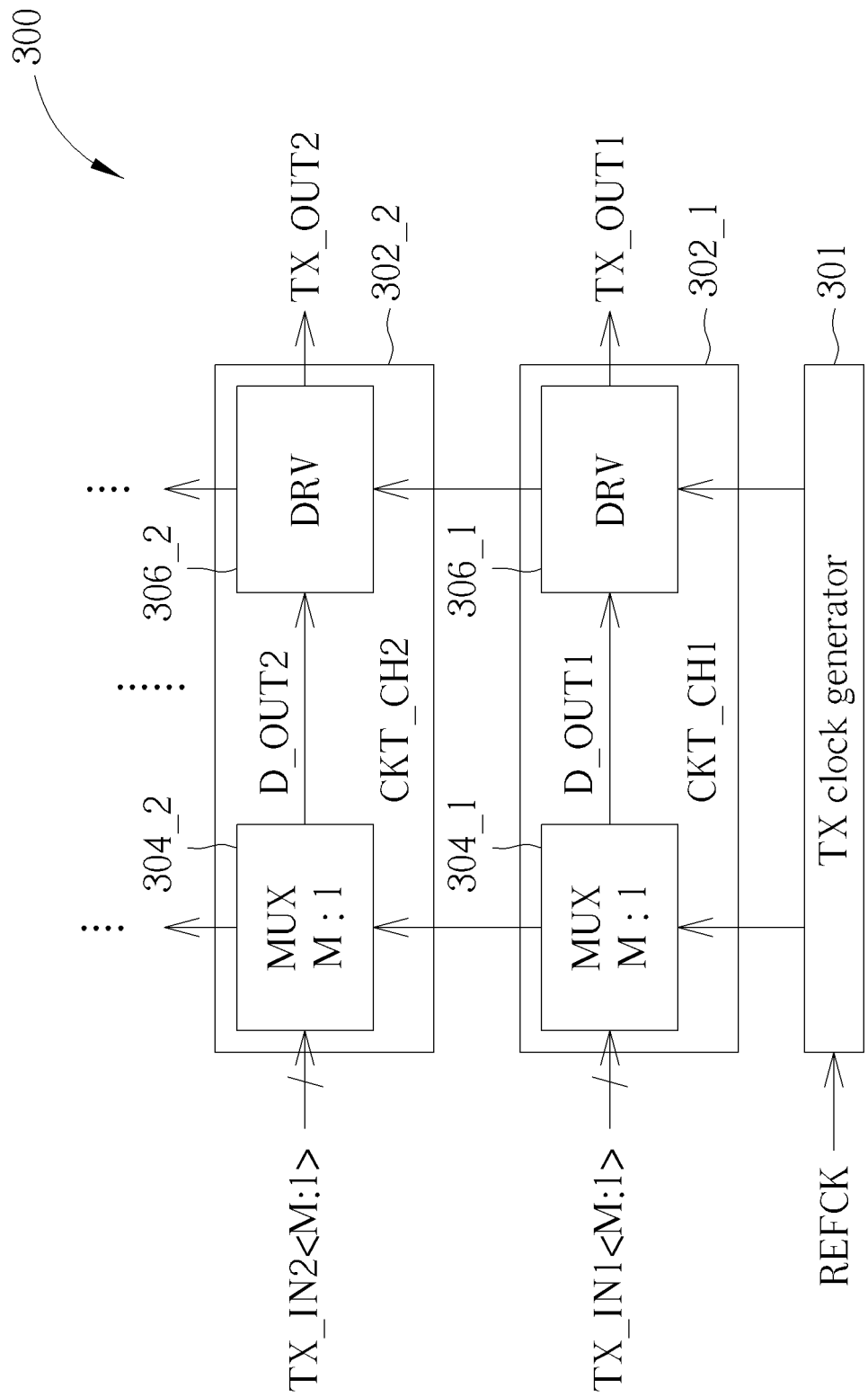
FIG. 3 is a diagram illustrating a first TX design that is a part of a circuit design employed by a configurable IO interface circuit according to an embodiment of the present invention.

FIG. 3 is a diagram illustrating a first TX design that is a part of a circuit design employed by a configurable IO interface circuit according to an embodiment of the present invention. The TX circuit 300 includes a TX clock generator 301 and a plurality of channel circuits (e.g., 302_1 and 302_2). For brevity and simplicity, only two channel circuits are shown in FIG. 3. In practice, the number of channel circuits can be adjusted, depending upon the actual design considerations. All channel circuits implemented in the TX circuit 300 may have the same circuit design. As shown in FIG. 3, the channel circuit (labeled by "CKT_CH1") 302_1 includes a multiplexer (labeled by "MUX") 304_1 and a driving circuit (labeled by "DRV") 306_1 (which may include, for example, a pre-driver and a driver), and the channel circuit (labeled by "CKT_CH2") 302_2 includes a multiplexer (labeled by "MUX") 304_2 and a driving circuit (labeled by "DRV") 306_2 (which may include, for example, a pre-driver and a driver). The TX clock generator 301 is designed to employ a clock generation technique (e.g., phase-locked loop) for generating clocks required by normal operations of internal components of the channel circuits 302_1 and 302_2 according to a reference clock REFCK. Regarding the channel circuit 302_1, the multiplexer 304_1 is arranged to multiplex a parallel data input TX_IN1<M:1> to generate a serial data output D_OUT1, and the driving circuit 306_1 is arranged to generate and output a TX bitstream TX_OUT1 according to the serial data output D_OUT1. Regarding the channel circuit 302_2, the multiplexer 304_2 is arranged to multiplex a parallel data input TX_IN2<M:1> to generate a serial data output D_OUT2, and the driving circuit 306_2 is arranged to generate and output a TX bitstream TX_OUT2 according to the serial data output D_OUT2.

When the same circuit design (which includes the TX design shown in FIG. 3) is employed by any of the configurable IO interface circuits, the TX circuit 300 is configured to act as a part of a single-ended IO interface for intra-package (die-to-die) communication or a part of a differential IO interface for inter-package (chip-to-chip) communication.

Figure 4:
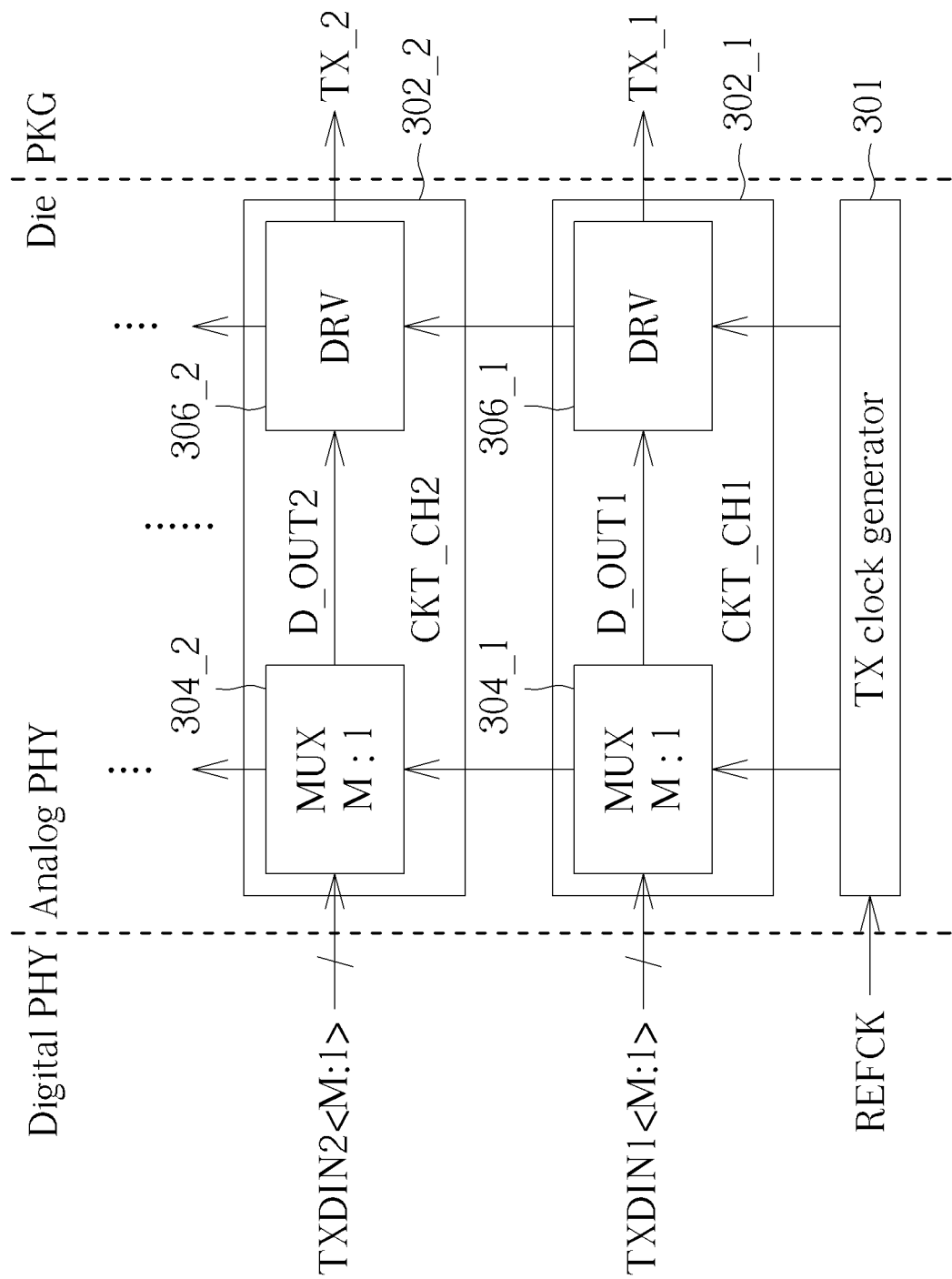
FIG. 4 is a diagram illustrating an embodiment of configuring the TX circuit shown in FIG. 3 as apart of a single-ended IO interface for intra-package (die-to-die) communication.

FIG. 4 is a diagram illustrating an embodiment of configuring the TX circuit 300 as a part of a single-ended IO interface for intra-package (die-to-die) communication. When the same circuit design (which includes the TX design shown in FIG. 3) is employed by each of the configurable IO interface circuits 126 and 130, each of the configurable IO interface circuits 126 and 130 has the TX circuit 300 configured for single-ended intra-package (die-to-die) communication. Taking the configurable IO interface circuit 126 for example, the parallel data inputs TX_IN1<M:1> and TX_IN2<M:1> shown in FIG. 3 are set by single-ended non-clock data inputs TXDIN1<M:1> and TXDIN2<M:1> obtained from the processing circuit 134 (particularly, a digital physical layer (PHY) component of the processing circuit 134), respectively, and the TX bitstreams TX_OUT1 and TX_OUT2 shown in FIG. 3 are set by single-ended TX bitstreams TX_1 and TX_2, respectively, where the single-ended TX bitstreams TX_1 and TX_2 are transmitted from the configurable IO interface circuit 126 (which may be a part of an analog PHY component) to the configurable IO interface circuit 130 via a portion of the PKG traces 122 between dies 108 and 112.

Since a person skilled in the pertinent art can readily understand details of applying the same TX configuration shown in FIG. 4 to other configurable IO interface circuits that are configured to perform single-ended intra-package (die-to-die) communication, similar description is omitted here for brevity.

Figure 5:
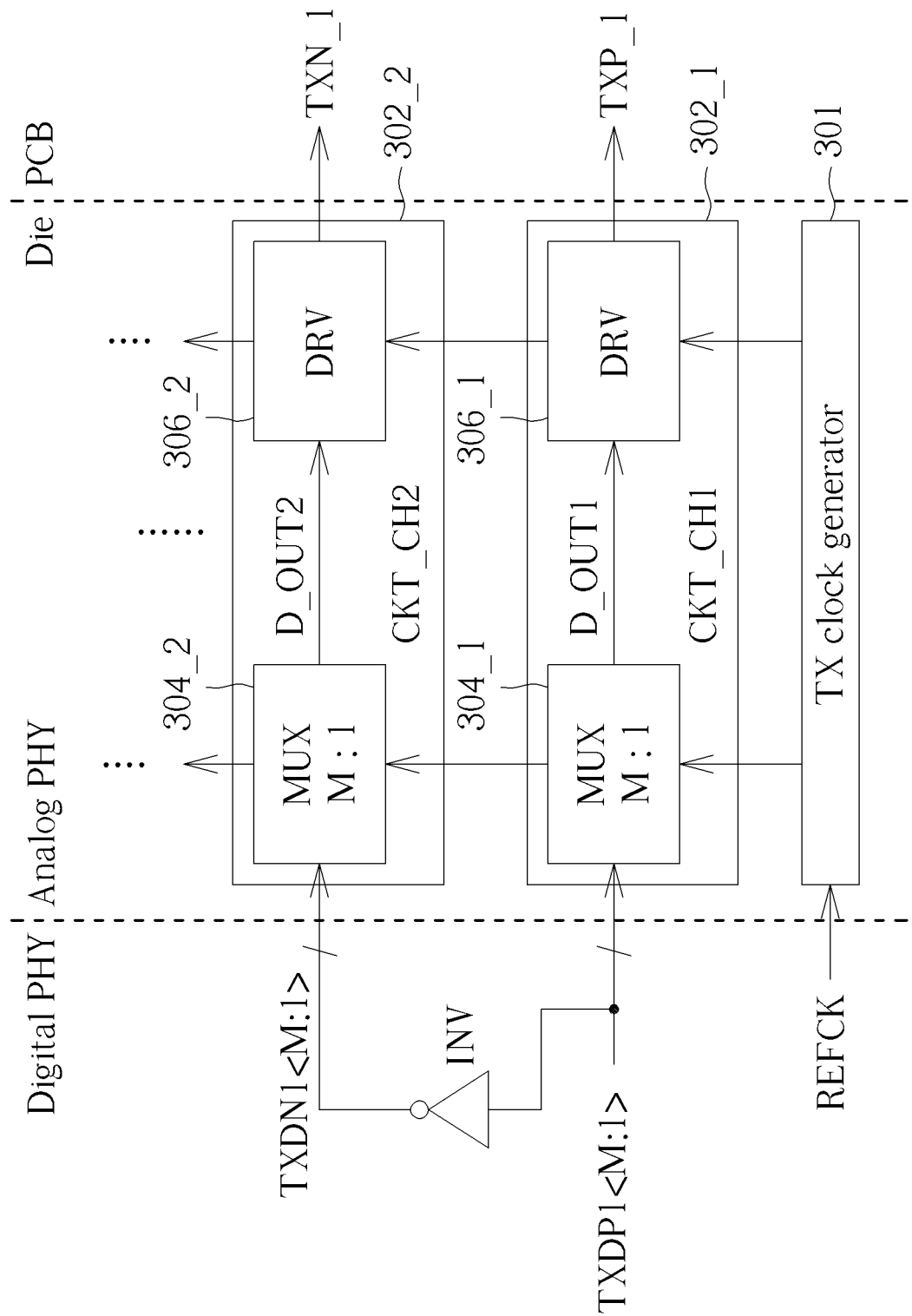
FIG. 5 is a diagram illustrating an embodiment of configuring the TX circuit shown in FIG. 3 as a part of a differential IO interface for inter-package (chip-to-chip) communication.

FIG. 5 is a diagram illustrating an embodiment of configuring the TX circuit 300 as a part of a differential IO interface for inter-package (chip-to-chip) communication. When the same circuit design (which includes the TX design shown in FIG. 3) is employed by each of the configurable IO interface circuits 128 and 132, each of the configurable IO interface circuits 128 and 132 has the TX circuit 300 configured for differential inter-package (chip-to-chip) communication. Taking the configurable IO interface circuit 128 for example, the parallel data inputs TX_IN1<M:1> and TX_IN2<M:1> shown in FIG. 3 are set by a differential non-clock data input consisting of a positive data input TXDP1<M:1> and a negative data input TXDN1<M:1> obtained from the processing circuit 134 (particularly, a digital PHY component of the processing circuit 134), and the TX bitstreams TX_OUT1 and TX_OUT2 shown in FIG. 3 are set by a differential TX bitstream consisting of a positive bitstream TXP_1 and a negative bitstream TXN_1, where each of the positive data input TXDP1<M:1> and the negative data input TXDN1<M:1> is a parallel data input, and the processing circuit 134 may include an inverter INV arranged to generate an inverse version of the positive data input TXDP1<M:1> as the negative data input TXDN1<M:1>, and the differential TX bitstream (TXP_1, TXN_1) is transmitted from the configurable IO interface circuit 128 (which may be apart of an analog PHY component) to the configurable IO interface circuit 132 via a portion of the PCB traces 124 between dies 108 and 114.

Since a person skilled in the pertinent art can readily understand details of applying the same TX configuration shown in FIG. 5 to other configurable IO interface circuits that are configured to perform differential inter-package (chip-to-chip) communication, similar description is omitted here for brevity.

In some embodiments, a clock and data recovery (CDR) circuit may be implemented in an RX circuit, such that no clock data is needed to be transmitted from a TX circuit to the RX circuit. Regarding any configurable IO interface circuit employing the TX configuration shown in FIG. 4 for single-ended intra-package (die-to-die) communication, no single-ended clock data input is received for transmission over intra-package traces. Regarding any configurable IO interface circuit employing the TX configuration shown in FIG. 5 for differential inter-package (chip-to-chip) communication, no differential clock data input is received for transmission over inter-package traces.

In some embodiments, clock forwarding scheme may be employed to remove a CDR circuit from an RX circuit for power saving. Hence, clock data is required to be transmitted from a TX circuit to the RX circuit. In other words, a dedicated single-ended clock data bitstream (which has a regular bit pattern indicative of the clock information) should be transmitted by a configurable IO interface circuit if the configurable IO interface circuit is configured to perform single-ended intra-package (die-to-die) communication, and a dedicated differential clock data bitstream (which has a regular bit pattern indicative of the clock information) should be transmitted by a configurable IO interface circuit if the configurable IO interface circuit is configured to perform differential inter-package (chip-to-chip) communication.

Figure 6:
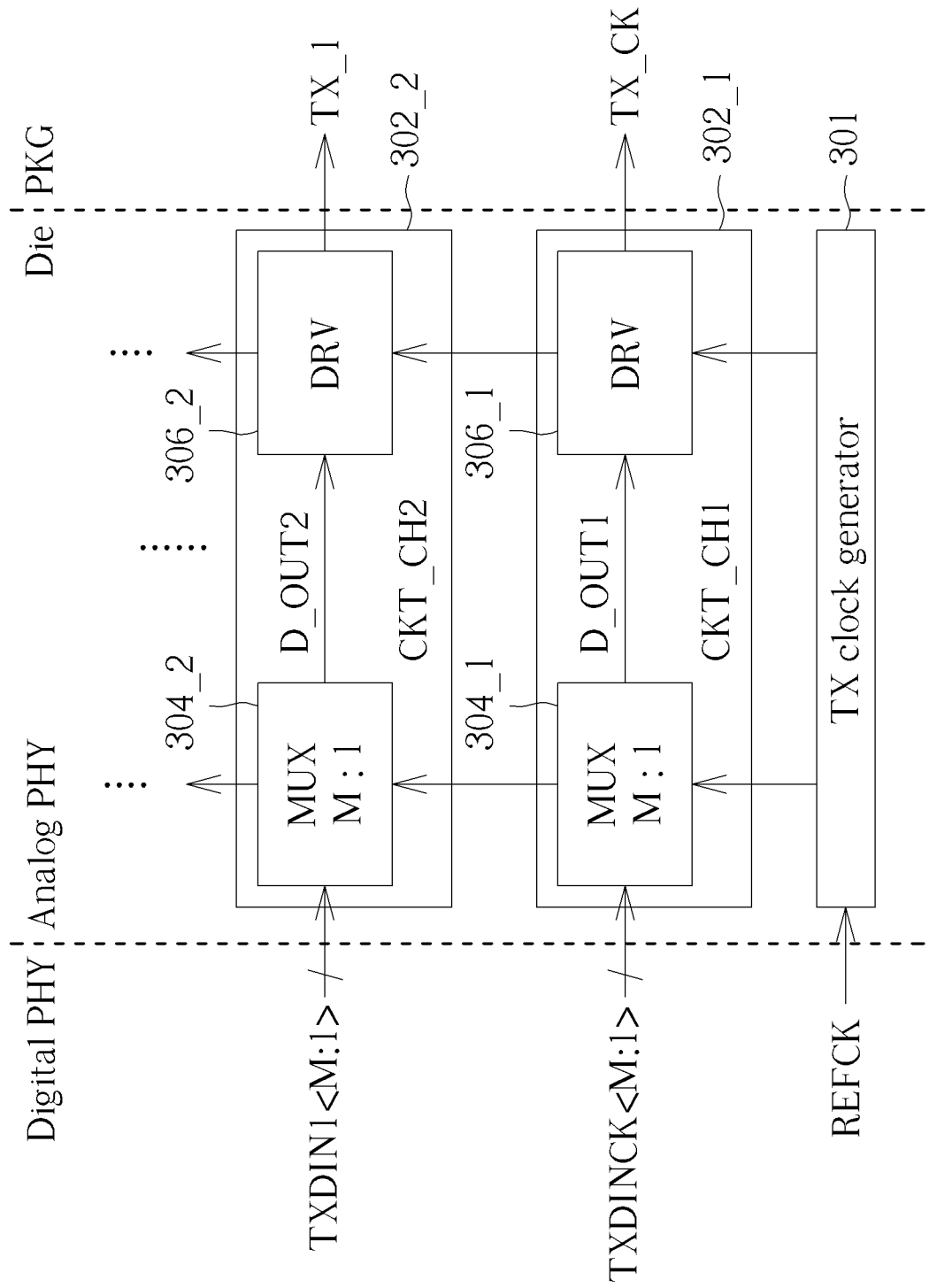
FIG. 6 is a diagram illustrating another embodiment of configuring the TX circuit shown in FIG. 3 as a part of a single-ended IO interface for intra-package (die-to-die) communication.

FIG. 6 is a diagram illustrating another embodiment of configuring the TX circuit 300 as a part of a single-ended IO interface for intra-package (die-to-die) communication. When the same circuit design (which includes the TX design shown in FIG. 3) is employed by each of the configurable IO interface circuits 126 and 130, each of the configurable IO interface circuits 126 and 130 has the TX circuit 300 configured for single-ended intra-package (die-to-die) communication. Taking the configurable IO interface circuit 126 for example, the parallel data inputs TX_IN1<M:1> and TX_IN2<M:1> shown in FIG. 3 are set by a single-ended clock data input TXDINCK<M:1> and a single-ended non-clock data input TXDIN1<M:1> obtained from the processing circuit 134 (particularly, a digital PHY component of the processing circuit 134), respectively, and the TX bitstreams TX_OUT1 and TX_OUT2 shown in FIG. 3 are set by single-ended TX bitstreams TX_CK and TX_1, respectively, where the single-ended TX bitstream TX_CK has a regular bit pattern indicative of the clock information, and the single-ended TX bitstreams TX_CK and TX_1 are transmitted from the configurable IO interface circuit 126 (which may be a part of an analog PHY component) to the configurable IO interface circuit 130 via a portion of the PKG traces 122 between dies 108 and 112.

Since a person skilled in the pertinent art can readily understand details of applying the same TX configuration shown in FIG. 6 to other configurable IO interface circuits that are configured to perform single-ended intra-package (die-to-die) communication, similar description is omitted here for brevity.

Figure 7:
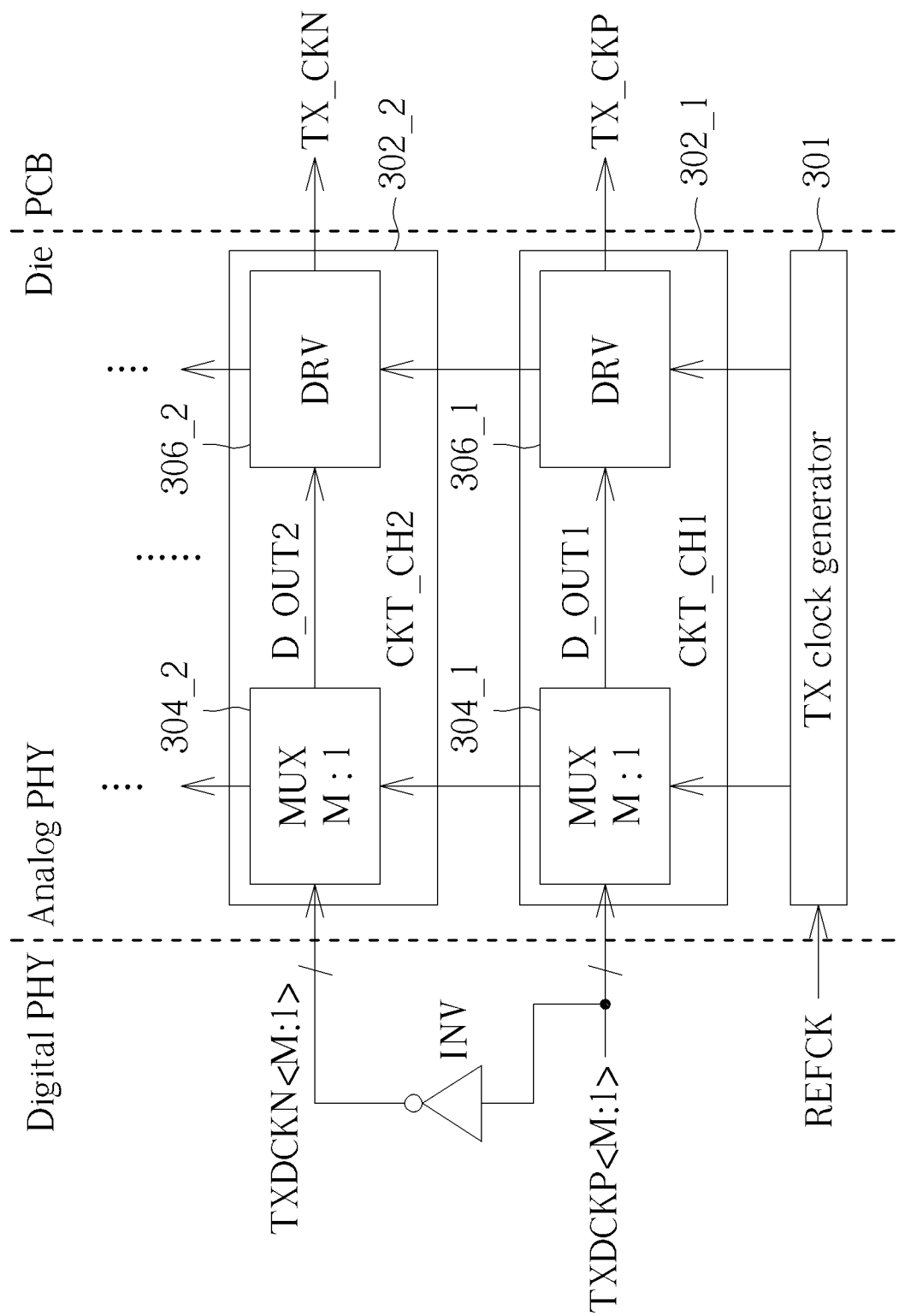
FIG. 7 is a diagram illustrating another embodiment of configuring the TX circuit shown in FIG. 3 as a part of a differential IO interface for inter-package (chip-to-chip) communication.

FIG. 7 is a diagram illustrating another embodiment of configuring the TX circuit 300 as a part of a differential IO interface for inter-package (chip-to-chip) communication. When the same circuit design (which includes the TX design shown in FIG. 3) is employed by each of the configurable IO interface circuits 128 and 132, each of the configurable IO interface circuits 128 and 132 has the TX circuit 300 configured for differential inter-package (chip-to-chip) communication. Taking the configurable IO interface circuit 128 for example, the parallel data inputs TX_IN1<M:1> and TX_IN2<M:1> shown in FIG. 3 are set by a differential clock data input consisting of a positive data input TXDCKP<M:1> and a negative data input TXDCKN<M:1> obtained from the processing circuit 134 (particularly, a digital PHY component of the processing circuit 134), and the TX bitstreams TX_OUT1 and TX_OUT2 shown in FIG. 3 are set by a differential TX bitstream consisting of a positive bitstream TX_CKP and a negative bitstream TX_CKN, where each of the positive data input TXDCKP<M:1> and the negative data input TXDCKN<M:1> is a parallel data input, the processing circuit 134 may include an inverter INV arranged to generate an inverse version of the positive data input TXDCKP<M:1> as the negative data input TXDCKN<M:1>, and the differential bitstream (TXP_1, TXN_1) that has a regular bit pattern indicative of the clock information is transmitted from the configurable IO interface circuit 128 (which may be a part of an analog PHY component) to the configurable IO interface circuit 132 via a portion of the PCB traces 124 between dies 108 and 114.

Since a person skilled in the pertinent art can readily understand details of applying the same TX configuration shown in FIG. 7 to other configurable IO interface circuits that are configured to perform differential inter-package (chip-to-chip) communication, similar description is omitted here for brevity.

Figure 8:
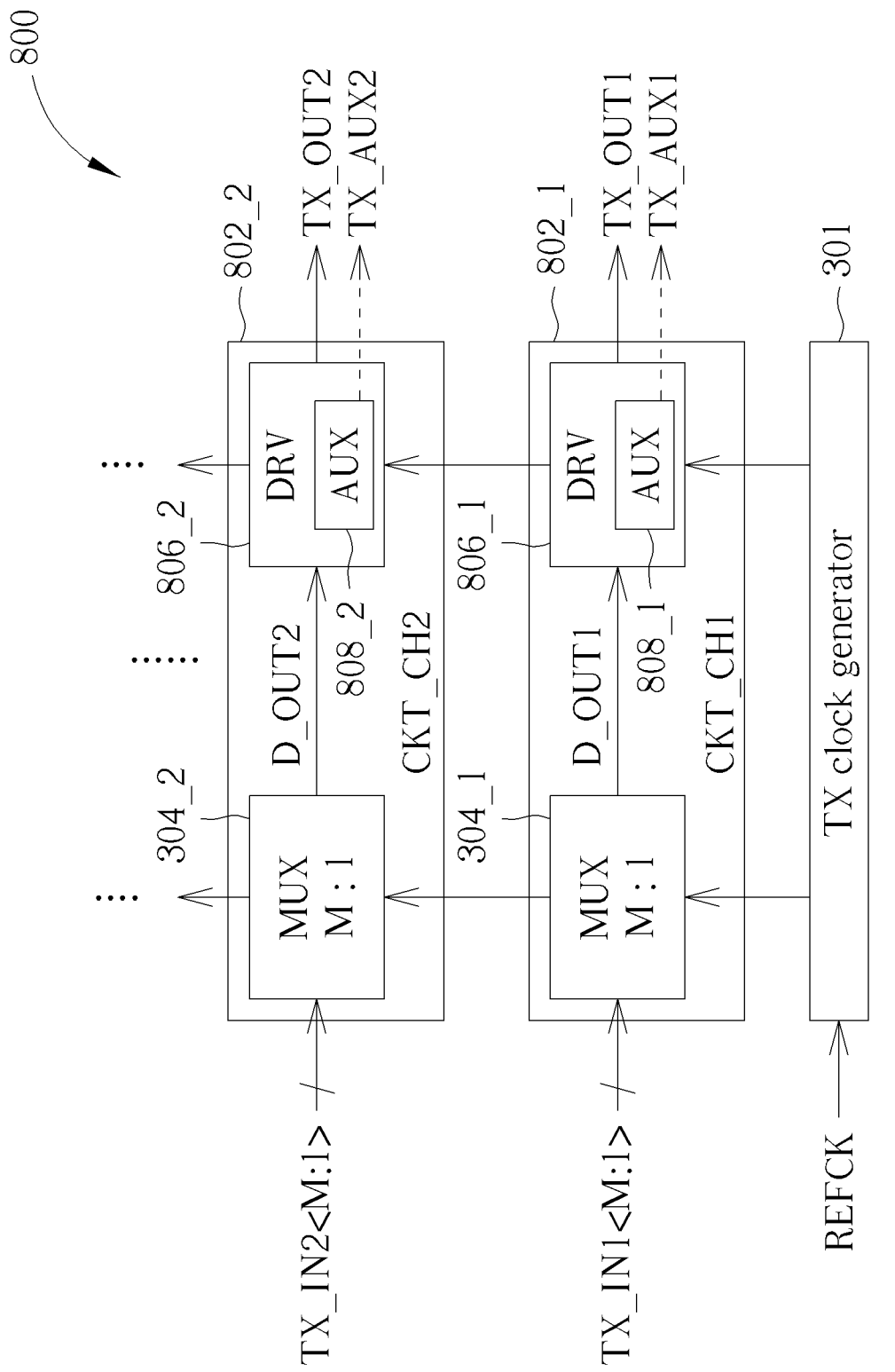
FIG. 8 is a diagram illustrating a second TX design that is a part of a circuit design employed by a configurable IO interface circuit according to an embodiment of the present invention.

FIG. 8 is a diagram illustrating a second TX design that is a part of a circuit design employed by a configurable IO interface circuit according to an embodiment of the present invention. The TX circuit 800 includes a plurality of channel circuits (e.g., 802_1 and 802_2) and the aforementioned TX clock generator 301. For brevity and simplicity, only two channel circuits are shown in FIG. 8. In practice, the number of channel circuits can be adjusted, depending upon the actual design considerations. All channel circuits implemented in the TX circuit 800 may have the same circuit design. As shown in FIG. 8, the channel circuit (labeled by "CKT_CH1") 802_1 includes the aforementioned multiplexer (labeled by "MUX") 304 land a driving circuit (labeled by "DRV") 806_1 (which may include, for example, a pre-driver and a driver), and the channel circuit (labeled by "CKT_CH2") 802_2 includes the aforementioned multiplexer (labeled by "MUX") 304_2 and a driving circuit (labeled by "DRV") 806_2 (which may include, for example, a pre-driver and a driver). The major difference between the driving circuits 302_1 and 802_1 is that the driving circuit 802_1 is shown having an auxiliary circuit (labeled by "AUX") 808_1. Similarly, the major difference between the driving circuits 302_2 and 802_2 is that the driving circuit 802_2 is shown having an auxiliary circuit (labeled by "AUX") 808_2.

The TX clock generator 301 is designed to employ a clock generation technique (e.g., phase-locked loop) for generating clocks required by normal operations of internal components of the channel circuits 802_1 and 802_2 according to a reference clock REFCK. Regarding the channel circuit 802_1, the multiplexer 304_1 is arranged to multiplex a parallel data input TX_IN1<M:1> to generate a serial data output D_OUT1, the driving circuit 806_1 is arranged to generate and output a TX bitstream TX_OUT1 according to the serial data output D_OUT1, and the auxiliary circuit 808_1 implemented in the driving circuit 806_1 is arranged to generate a TX bitstream TX_AUX1 according to the same serial data output D_OUT1, where the TX bitstream TX_AUX1 is an inverse version of the TX bitstream TX_OUT1, such that TX bitstreams TX_OUT1 and TX_AUX1 output from the driving circuit 806_1 can form a differential TX bitstream. Regarding the channel circuit 802_2, the multiplexer 304_2 is arranged to multiplex a parallel data input TX_IN2<M:1> to generate a serial data output D_OUT2, the driving circuit 806_2 is arranged to generate and output a TX bitstream TX_OUT2 according to the serial data output D_OUT2, and the auxiliary circuit 808_2 implemented in the driving circuit 806_2 is arranged to generate a TX bitstream TX_AUX2 according to the same serial data output D_OUT2, where the TX bitstream TX_AUX2 is an inverse version of the TX bitstream TX_OUT2, such that TX bitstreams TX_OUT2 and TX_AUX2 output from the driving circuit 806_2 can forma differential TX bitstream.

When the circuit design (which includes the TX design shown in FIG. 8) is employed by any of the configurable IO interface circuits, the TX circuit 800 is configured to act as a part of a single-ended IO interface for intra-package (die-to-die) communication or a part of a differential IO interface for inter-package (chip-to-chip) communication.

Figure 9:
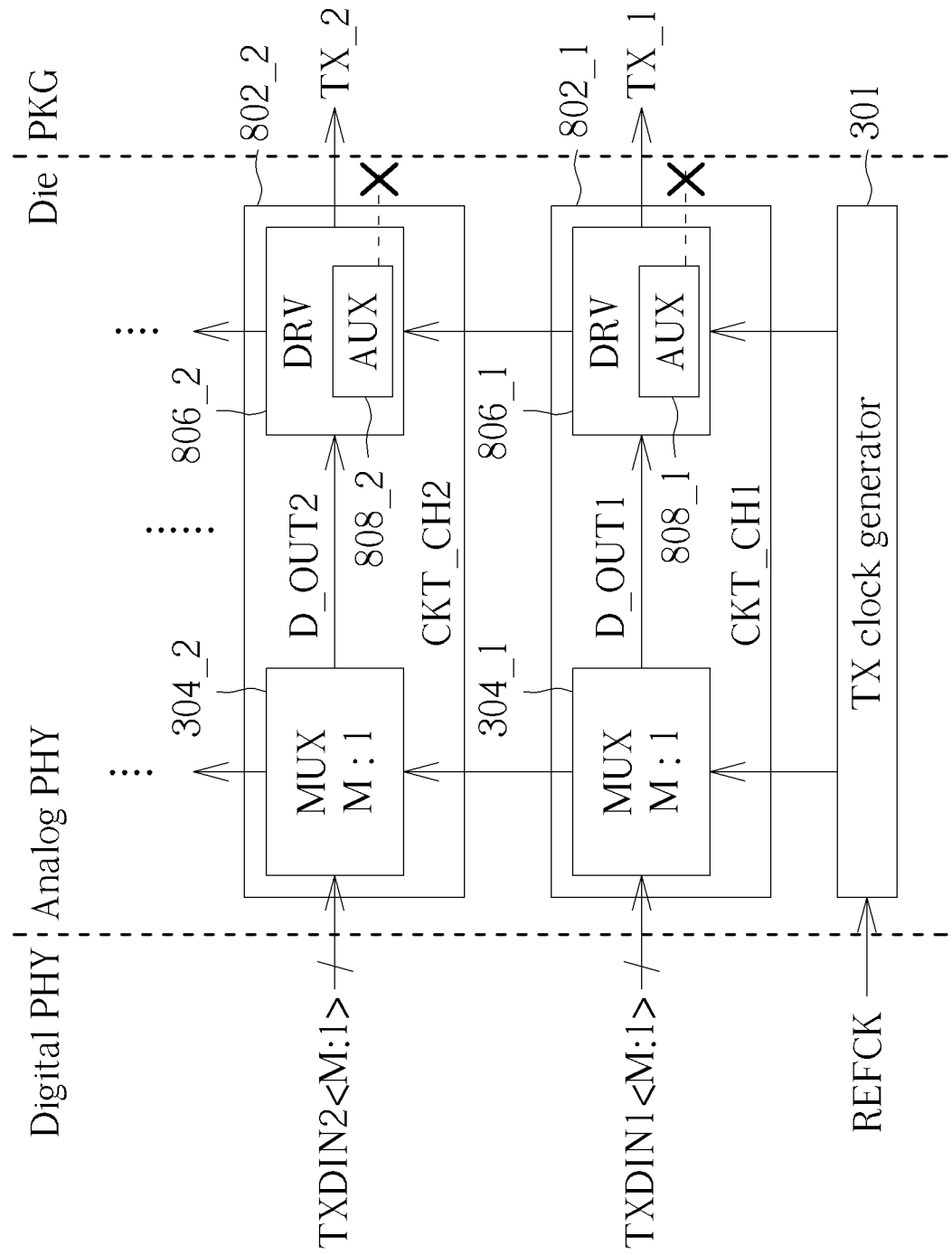
FIG. 9 is a diagram illustrating an embodiment of configuring the TX circuit shown in FIG. 8 as apart of a single-ended IO interface for intra-package (die-to-die) communication.

FIG. 9 is a diagram illustrating an embodiment of configuring the TX circuit 800 as a part of a single-ended IO interface for intra-package (die-to-die) communication. When the same circuit design (which includes the TX design shown in FIG. 8) is employed by each of the configurable IO interface circuits 126 and 130, each of the configurable IO interface circuits 126 and 130 has the TX circuit 800 configured for single-ended intra-package (die-to-die) communication. Taking the configurable IO interface circuit 126 for example, the parallel data inputs TX_IN1<M:1> and TX_IN2<M:1> shown in FIG. 8 are set by single-ended non-clock data inputs TXDIN1<M:1> and TXDIN2<M:1> obtained from the processing circuit 134 (particularly, a digital PHY component of the processing circuit 134), respectively, and the TX bitstreams TX_OUT1 and TX_OUT2 shown in FIG. 8 are set by single-ended TX bitstreams TX_1 and TX_2, respectively, where the auxiliary circuit 808_1 does not output the TX bitstream TX_AUX1 to any PKG trace 122 between dies 108 and 112, the auxiliary circuit 808_2 does not output the TX bitstream TX_AUX2 to any PKG trace 122 between dies 108 and 112, and the single-ended TX bitstreams TX_1 and TX_2 are transmitted from the configurable IO interface circuit 126 (which may be a part of an analog PHY component) to the configurable IO interface circuit 130 via a portion of the PKG traces 122 between dies 108 and 112. In some embodiments, the auxiliary circuits 808_1 and 808_2 may be configured to be disabled (or powered off) under the condition that the configurable IO interface circuit 126 is configured to perform single-ended intra-package (die-to-die) communication. Hence, the die 108 may have no pins assigned to outputs of the auxiliary circuits 808_1 and 808_2.

Since a person skilled in the pertinent art can readily understand details of applying the same TX configuration shown in FIG. 9 to other configurable IO interface circuits that are configured to perform single-ended intra-package (die-to-die) communication, similar description is omitted here for brevity.

Figure 10:
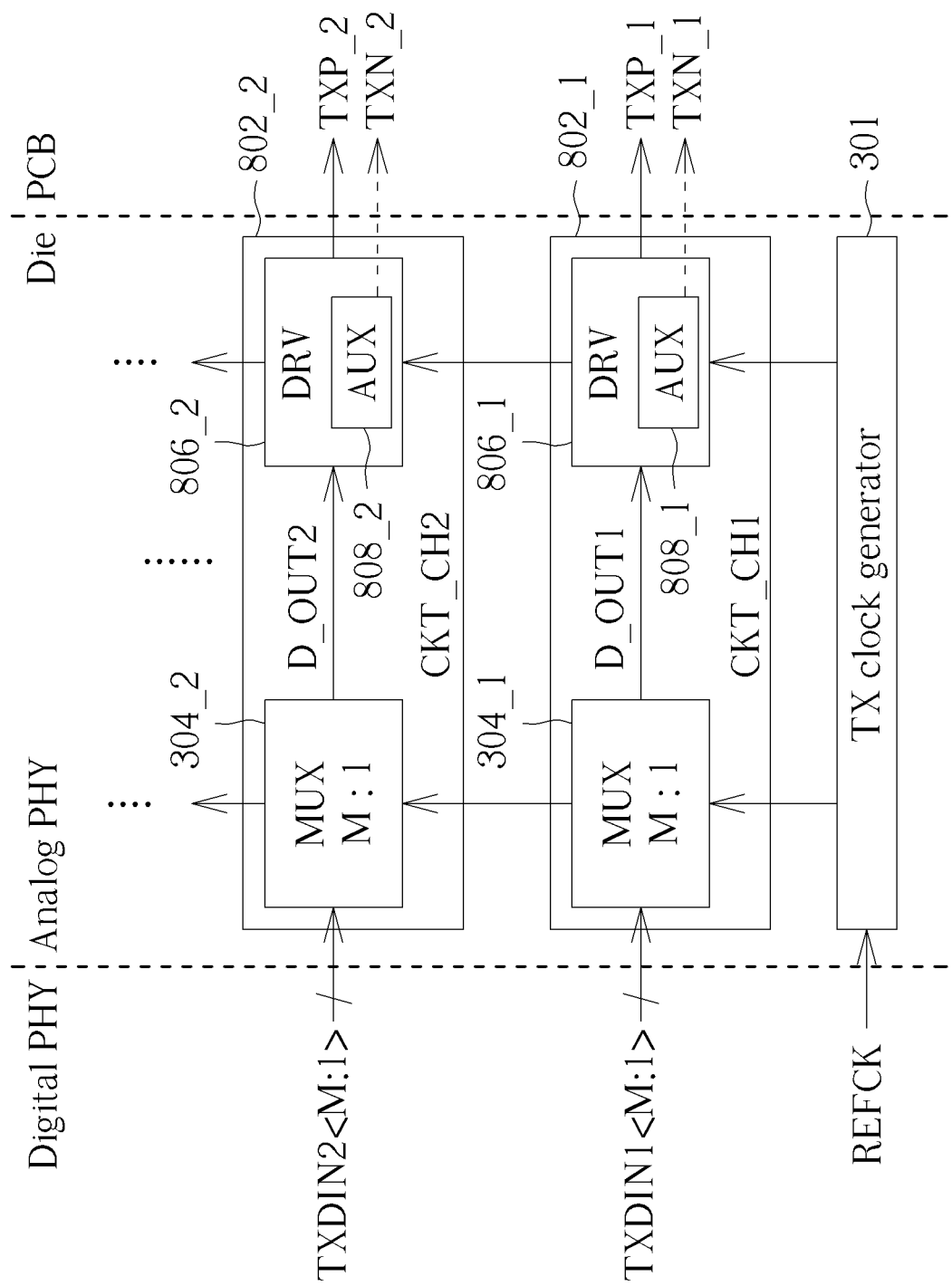
FIG. 10 is a diagram illustrating an embodiment of configuring the TX circuit shown in FIG. 8 as a part of a differential IO interface for inter-package (chip-to-chip) communication.

FIG. 10 is a diagram illustrating an embodiment of configuring the TX circuit 800 as a part of a differential IO interface for inter-package (chip-to-chip) communication. When the same circuit design (which includes the TX design shown in FIG. 8) is employed by each of the configurable IO interface circuits 128 and 132, each of the configurable IO interface circuits 128 and 132 has the TX circuit 800 configured for differential inter-package (chip-to-chip) communication. Taking the configurable IO interface circuit 128 for example, the parallel data inputs TX_IN1<M:1> and TX_IN2<M:1> shown in FIG. 8 are set by single-ended non-clock data inputs TXDIN1<M:1> and TXDIN2<M:1> obtained from the processing circuit 134 (particularly, a digital PHY component of the processing circuit 134), respectively, the TX bitstreams TX_OUT1 and TX_AUX1 shown in FIG. 8 are set by a differential TX bitstream consisting of a positive bitstream TXP_1 and a negative bitstream TXN_1, and the TX bitstreams TX_OUT2 and TX_AUX2 shown in FIG. 8 are set by a differential TX bitstream consisting of a positive bitstream TXP_2 and a negative bitstream TXN_2, where the driving circuit 806_1 enables a single-ended-to-differential conversion function with the use of the auxiliary circuit 808_1 for generating and outputting the differential TX bitstream (TXP_1, TXN_1) to a portion of the PCB traces 124 and the driving circuit 806_2 enables a single-ended-to-differential conversion function with the use of the auxiliary circuit 808_2 for generating and outputting the differential TX bitstream (TXP_2, TXN_2) to a portion of the PCB traces 124, such that each of differential bitstreams (TXP_1, TXN_1) and (TXP_2, TXN_2) is transmitted from the configurable IO interface circuit 128 (which may be a part of an analog PHY component) to the configurable IO interface circuit 132.

Since a person skilled in the pertinent art can readily understand details of applying the same TX configuration shown in FIG. 10 to other configurable IO interface circuits that are configured to perform differential inter-package (chip-to-chip) communication, similar description is omitted here for brevity.

As mentioned above, a CDR circuit may be implemented in an RX circuit, such that no clock data is needed to be transmitted from a TX circuit to the RX circuit. Regarding any configurable IO interface circuit employing the TX configuration shown in FIG. 9 for single-ended intra-package (die-to-die) communication, no single-ended clock data input is received for transmission over PKG traces. Regarding any configurable IO interface circuit employing the TX configuration shown in FIG. 10 for differential inter-package (chip-to-chip) communication, no differential clock data input is received for transmission over PCB traces.

As mentioned above, clock forwarding scheme may be employed to remove a CDR circuit from an RX circuit for power saving. Hence, clock data is required to be transmitted from a TX circuit to the RX circuit. In other words, a dedicated single-ended clock data bitstream (which has a regular bit pattern indicative of the clock information) should be transmitted by a configurable IO interface circuit if the configurable IO interface circuit is configured to perform single-ended intra-package (die-to-die) communication, and a dedicated differential clock data bitstream (which has a regular bit pattern indicative of the clock information) should be transmitted by a configurable IO interface circuit if the configurable IO interface circuit is configured to perform differential inter-package (chip-to-chip) communication.

Figure 11:
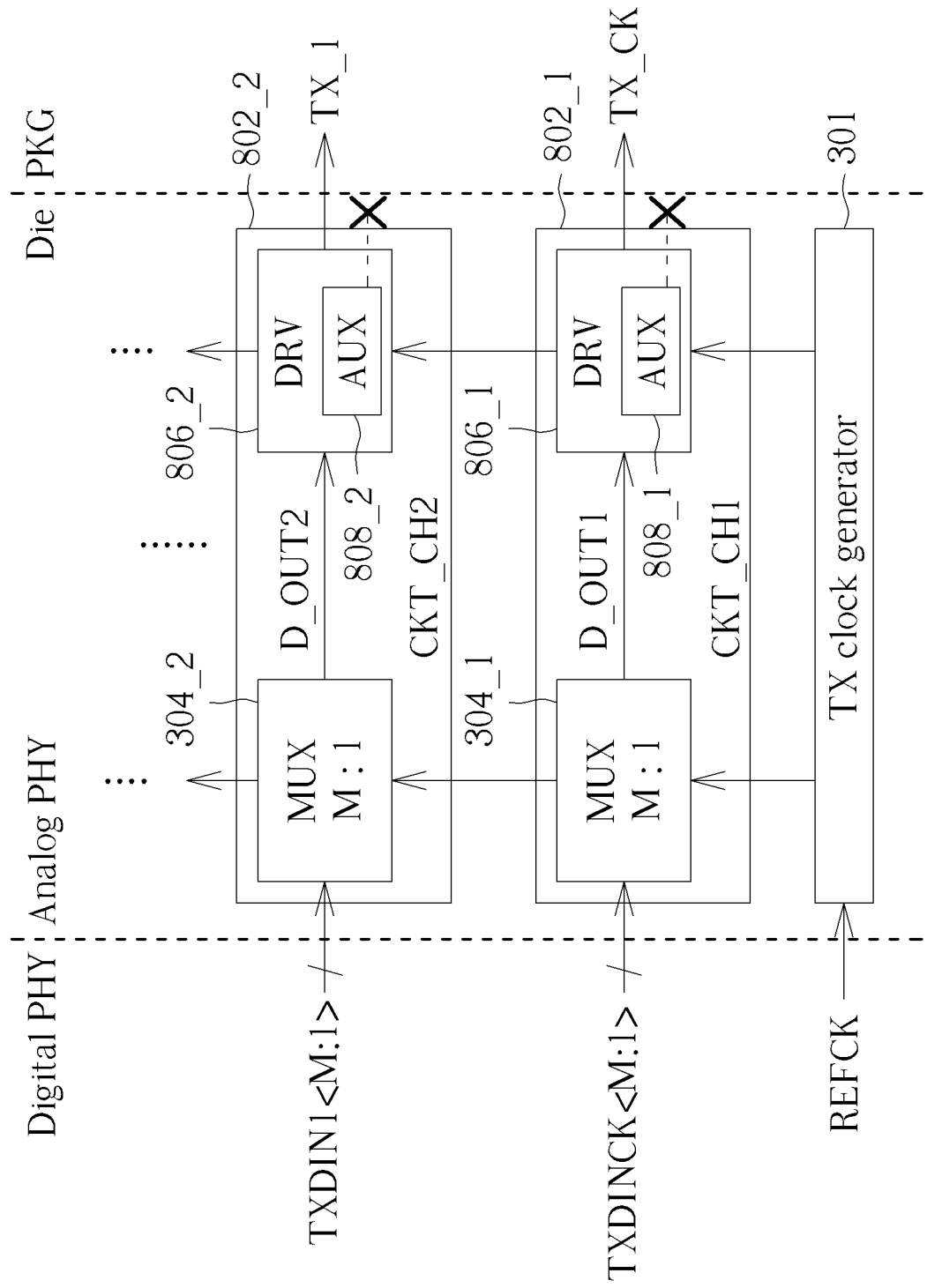
FIG. 11 is a diagram illustrating another embodiment of configuring the TX circuit shown in FIG. 8 as a part of a single-ended IO interface for intra-package (die-to-die) communication.

FIG. 11 is a diagram illustrating another embodiment of configuring the TX circuit 800 as a part of a single-ended IO interface for intra-package (die-to-die) communication. When the same circuit design (which includes the TX design shown in FIG. 8) is employed by each of the configurable IO interface circuits 126 and 130, each of the configurable IO interface circuits 126 and 130 has the TX circuit 800 configured for single-ended intra-package (die-to-die) communication. Taking the configurable IO interface circuit 126 for example, the parallel data inputs TX_IN1<M:1> and TX_IN2<M:1> shown in FIG. 8 are set by a single-ended clock data input TXDINCK<M:1> and a single-ended non-clock data input TXDIN1<M:1> obtained from the processing circuit 134 (particularly, a digital PHY component of the processing circuit 134), respectively, the TX bitstream TX_OUT1 shown in FIG. 8 is set by a single-ended TX bitstream TX_CK that has a regular bit pattern indicative of the clock information, and the TX bitstream TX_OUT2 shown in FIG. 8 is set by a single-ended TX bitstream TX_1, where the auxiliary circuit 808_1 does not output the TX bitstream TX_AUX1 to any of the PKG traces 122 between dies 108 and 112, the auxiliary circuit 808_2 does not output the TX bitstream TX_AUX2 to any of the PKG traces 122 between dies 108 and 112, and the single-ended TX bitstreams TX_CK and TX_1 are transmitted from the configurable IO interface circuit 126 (which may be a part of an analog PHY component) to the configurable IO interface circuit 130 via a portion of the PKG traces 122 between dies 108 and 112. In some embodiments, the auxiliary circuits 808_1 and 808_2 may be configured to be disabled (or powered off) under the condition that the configurable IO interface circuit 126 is configured to perform single-ended intra-package (die-to-die) communication. Hence, the die 108 may have no pins assigned to outputs of the auxiliary circuits 808_1 and 808_2.

Since a person skilled in the pertinent art can readily understand details of applying the same TX configuration shown in FIG. 11 to other configurable IO interface circuits that are configured to perform single-ended intra-package (die-to-die) communication, similar description is omitted here for brevity.

Figure 12:
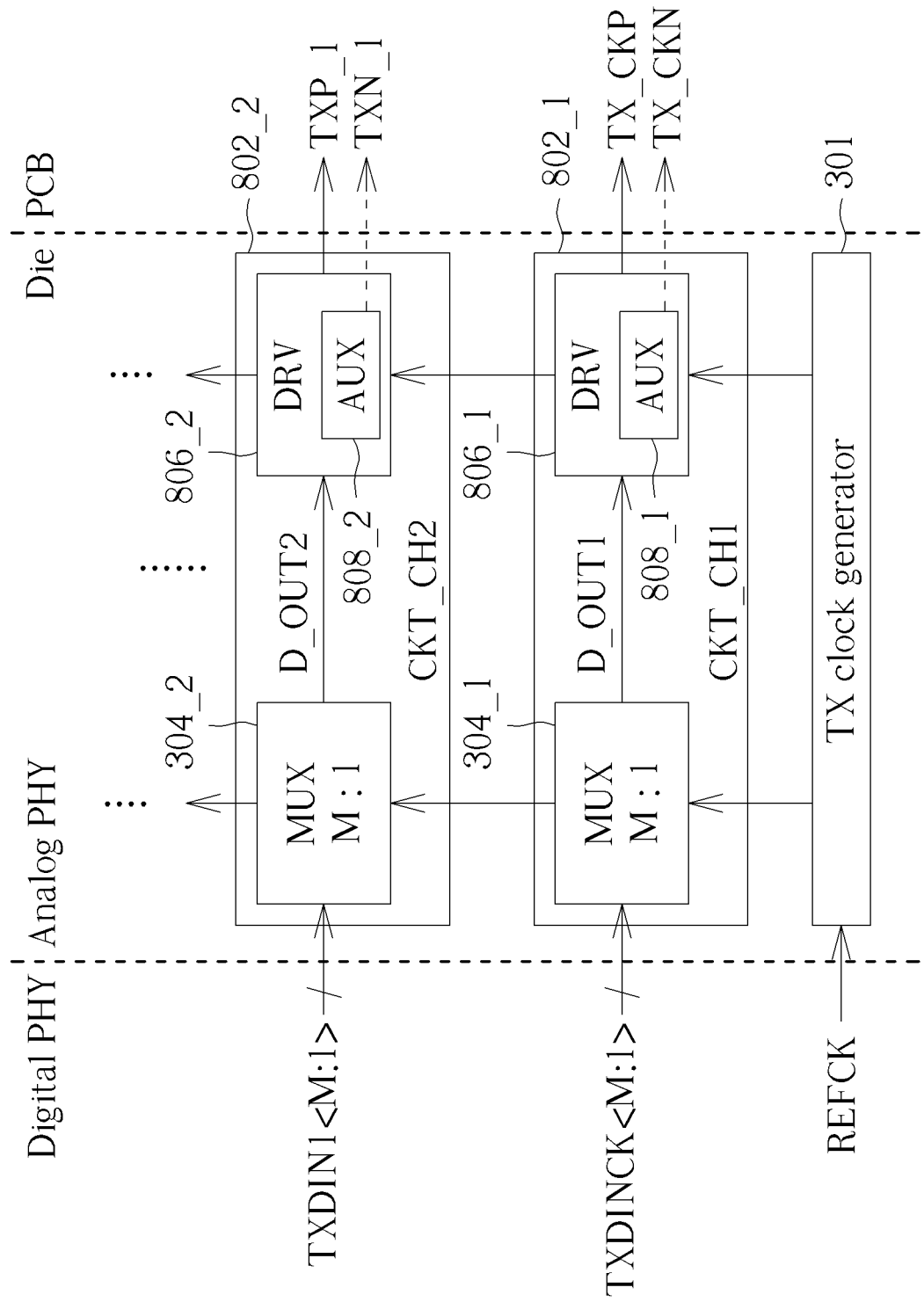
FIG. 12 is a diagram illustrating another embodiment of configuring the TX circuit shown in FIG. 8 as a part of a differential IO interface for inter-package (chip-to-chip) communication.

FIG. 12 is a diagram illustrating another embodiment of configuring the TX circuit 800 as a part of a differential IO interface for inter-package (chip-to-chip) communication. When the same circuit design (which includes the TX design shown in FIG. 8) is employed by each of the configurable IO interface circuits 128 and 132, each of the configurable IO interface circuits 128 and 132 has the TX circuit 800 configured for differential inter-package (chip-to-chip) communication. Taking the configurable IO interface circuit 128 for example, the parallel data inputs TX_IN1<M:1> and TX_IN2<M:1> shown in FIG. 8 are set by a single-ended clock data input TXDINCK<M:1> and a single-ended non-clock data input TXDIN1<M:1> obtained from the processing circuit 134 (particularly, a digital PHY component of the processing circuit 134), respectively, the TX bitstreams TX_OUT1 and TX_AUX1 shown in FIG. 8 are set by a differential TX bitstream consisting of a positive bitstream TX_CKP and a negative bitstream TX_CKN, and the TX bitstreams TX_OUT2 and TX_AUX2 shown in FIG. 8 are set by a differential TX bitstream consisting of a positive bitstream TXP_1 and a negative bitstream TXN_1, where the driving circuit 806_1 enables a single-ended-to-differential conversion function with the use of the auxiliary circuit 808_1 for generating and outputting the differential TX bitstream (TX_CKP, TX_CKN) to a portion of the PCB traces 124 and the driving circuit 806_2 enables a single-ended-to-differential conversion function with the use of the auxiliary circuit 808_2 for generating and outputting the differential TX bitstream (TXP_1, TXN_1) to a portion of the PCB traces 124, such that each of differential bitstreams (TX_CKP, TX_CKN) and (TXP_1, TXN_1) is transmitted from the configurable IO interface circuit 128 (which may be a part of an analog PHY component) to the configurable IO interface circuit 132.

Since a person skilled in the pertinent art can readily understand details of applying the same TX configuration shown in FIG. 12 to other configurable IO interface circuits that are configured to perform differential inter-package (chip-to-chip) communication, similar description is omitted here for brevity.

Figure 13:
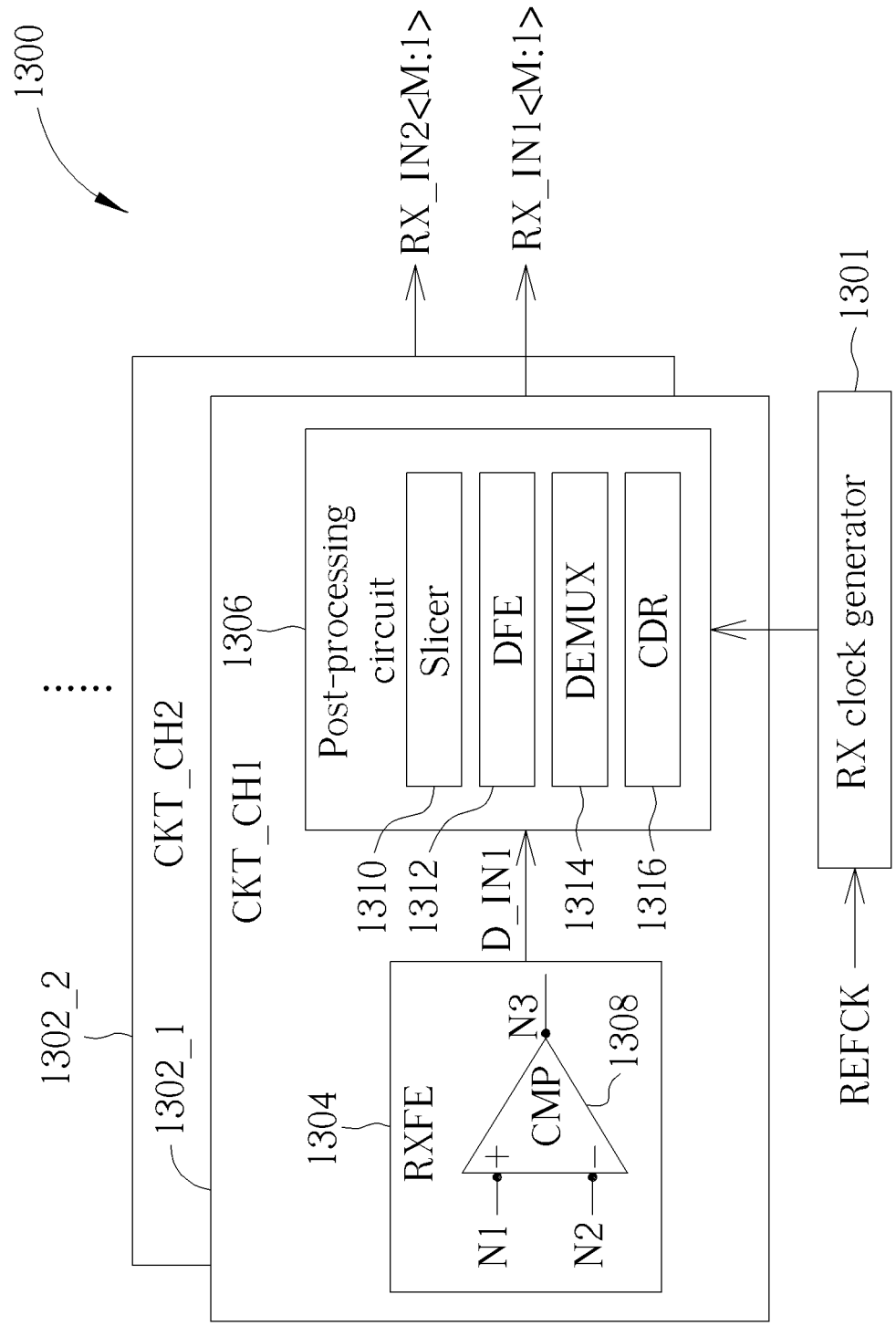
FIG. 13 is a diagram illustrating a first RX design that is a part of a circuit design employed by a configurable IO interface circuit according to an embodiment of the present invention.

FIG. 13 is a diagram illustrating a first RX design that is a part of a circuit design employed by a configurable IO interface circuit according to an embodiment of the present invention. The RX circuit 1300 includes an RX clock generator 1301 and a plurality of channel circuits (e.g., 1302_1 and 1302_2). For brevity and simplicity, only two channel circuits are shown in FIG. 13. In practice, the number of channel circuits can be adjusted, depending upon the actual design considerations. All channel circuits implemented in the RX circuit 1300 may have the same circuit design. As shown in FIG. 13, the channel circuit (labeled by "CKT_CH1") 1302_1 includes an RX front-end circuit (labeled by "RXFE") 1304 and a post-processing circuit 1306. The RX clock generator 1301 is designed to employ a clock generation technique (e.g., phase-locked loop) for generating clocks required by normal operations of internal components of the channel circuits 1302_1 and 1302_2 according to a reference clock REFCK. The RX front-end circuit 1304 includes a comparator circuit (labeled by "CMP") 1308 that has a first input node N1, a second input node N2, and an output node N3, wherein a serial data input D_IN1 generated from the RX front-end circuit 1304 is derived from a comparator output at the output node N3. The post-processing circuit 1306 is arranged to generate and output a parallel data input RX_IN1<M:1> according to the serial data input D_IN1. The post-processing circuit 1306 may include one or more post-processing blocks, such as a slicer 1310, a decision feedback equalizer (DFE) 1312, a demultiplexer (DEMUX) 1314, and/or a clock and data recovery circuit (labeled by "CDR") 1316. Since the channel circuits 1302_1 and 1302 have the same circuit design, the channel circuit 1302_2 generates and outputs a parallel data input RX_IN2<M:1>.

When the circuit design (which includes the RX design shown in FIG. 13) is employed by any of the configurable IO interface circuits, the RX circuit 1300 is configured to act as a part of a single-ended IO interface for intra-package (die-to-die) communication or a part of a differential IO interface for inter-package (chip-to-chip) communication.

Figure 14:
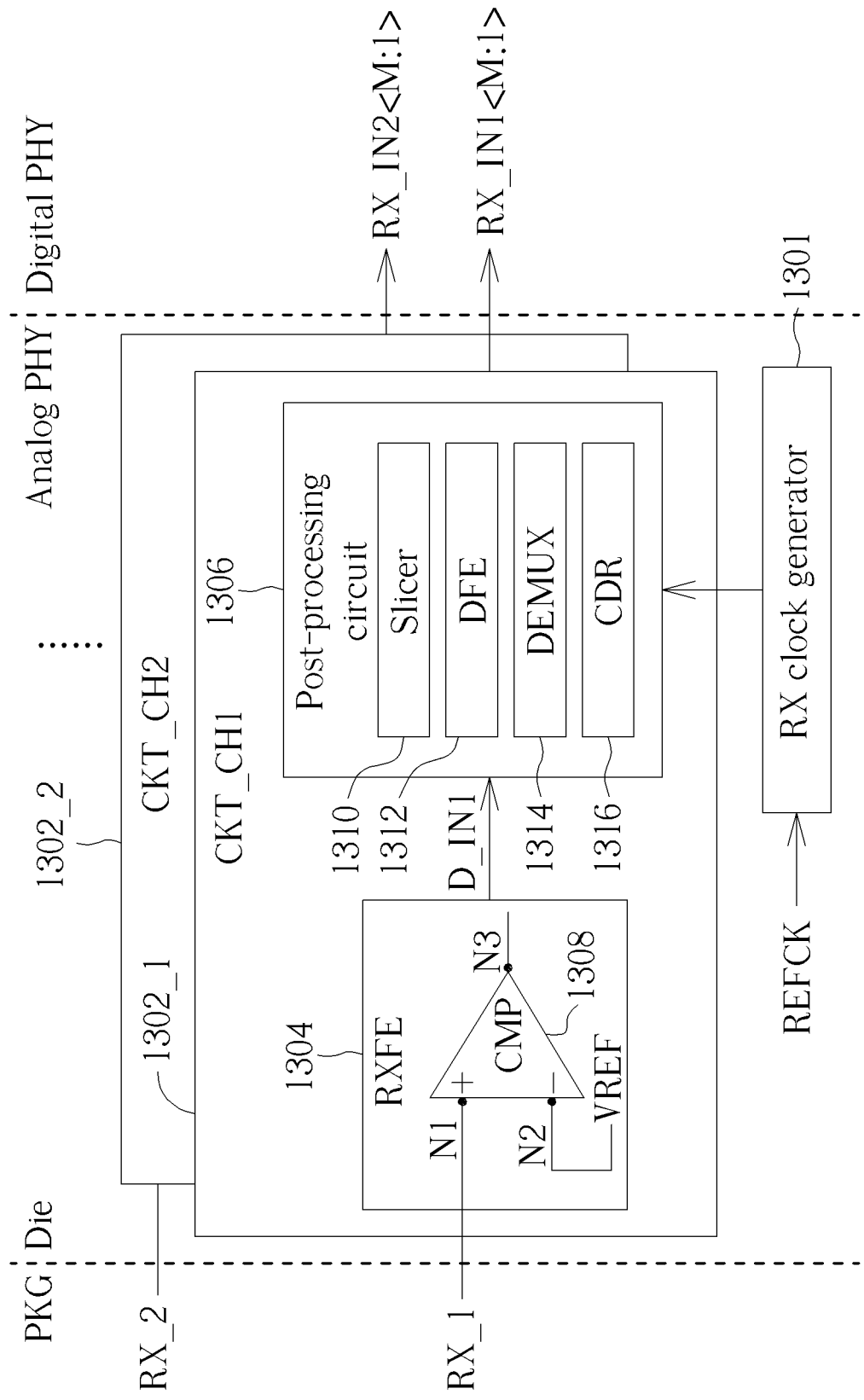
FIG. 14 is a diagram illustrating an embodiment of configuring the RX circuit shown in FIG. 13 as a part of a single-ended IO interface for intra-package (die-to-die) communication.

FIG. 14 is a diagram illustrating an embodiment of configuring the RX circuit 1300 as a part of a single-ended IO interface for intra-package (die-to-die) communication. When the same circuit design (which includes the RX design shown in FIG. 13) is employed by each of the configurable IO interface circuits 126 and 130, each of the configurable IO interface circuits 126 and 130 has the RX circuit 1300 configured for single-ended intra-package (die-to-die) communication. Taking the configurable IO interface circuit 126 for example, one single-ended RX bitstream RX_1 (which is transmitted via a portion of the PKG traces 122) is received by the channel circuit 1302_1 and another single-ended RX bitstream RX_2 (which is transmitted via a portion of the PKG traces 122) is received by the channel circuit 1302_2, such that the parallel data input RX IN1<M:1> is generated and output by the channel circuit 1302_1 in response to the single-ended RX bitstream RX_1 (which is not a dedicated clock data bitstream with a regular bit pattern), and the parallel data input RX IN2<M:1> is generated and output by the channel circuit 1302_2 in response to the single-ended RX bitstream RX_2 (which is not a dedicated clock data bitstream with a regular bit pattern).

In this embodiment, the post-processing circuit 1306 of each channel circuit implemented in the configurable IO interface circuit 126 includes the CDR circuit 1316. Hence, no dedicated single-ended clock data bitstream is received by the configurable IO interface circuit 126. Taking the channel circuit 1302_1 for example, the first input node N1 of the comparator 1308 is configured to receive the single-ended RX bitstream RX_1, and the second input node N2 of the comparator 1308 is configured to receive a reference voltage VREF that is an internal voltage of the die 108 (i.e., a voltage that is generated internally or inherently). The parallel data inputs RX IN1<M:1> and RX IN2<M:1> obtained by the configurable IO interface circuit 126 (which may be a part of an analog PHY component) are provided to the processing circuit 134 (particularly, a digital PHY component of the processing circuit 134) for further processing.

Since a person skilled in the pertinent art can readily understand details of applying the same RX configuration shown in FIG. 14 to other configurable IO interface circuits that are configured to perform single-ended intra-package (die-to-die) communication, similar description is omitted here for brevity.

Figure 15:
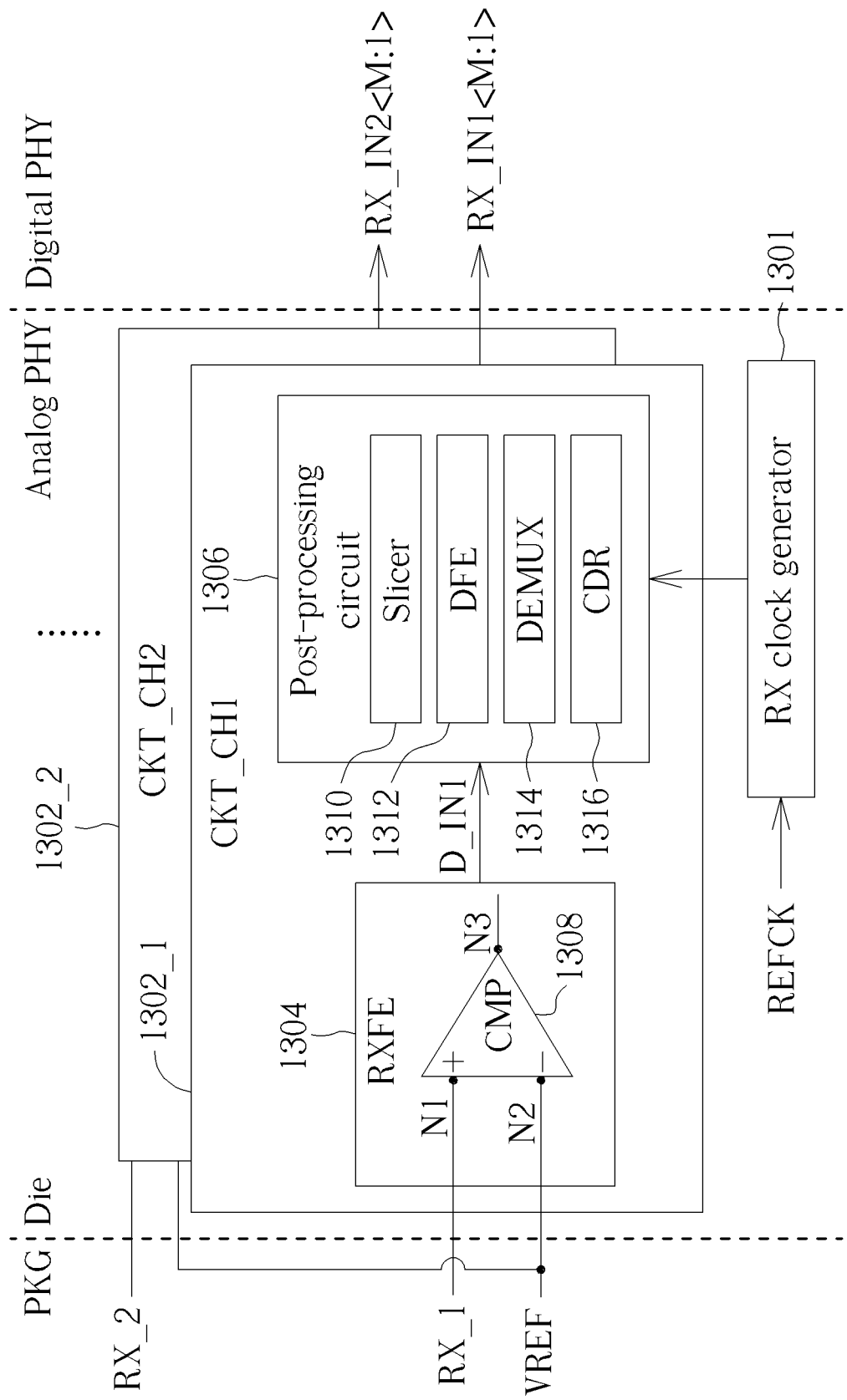
FIG. 15 is a diagram illustrating another embodiment of configuring the RX circuit shown in FIG. 13 as a part of a single-ended IO interface for intra-package (die-to-die) communication.

FIG. 15 is a diagram illustrating another embodiment of configuring the RX circuit 1300 as a part of a single-ended IO interface for intra-package (die-to-die) communication. When the same circuit design (which includes the RX design shown in FIG. 13) is employed by each of the configurable IO interface circuits 126 and 130, each of the configurable IO interface circuits 126 and 130 has the RX circuit 1300 configured for single-ended intra-package (die-to-die) communication. Taking the configurable IO interface circuit 126 for example, one single-ended RX bitstream RX_1 (which is transmitted via a portion of the PKG traces 122) is received by the channel circuit 1302_1 and another single-ended RX bitstream RX_2 (which is transmitted via a portion of the PKG traces 122) is received by the channel circuit 1302_2, such that the parallel data input RX IN1<M:1> is generated and output by the channel circuit 1302_1 in response to the single-ended RX bitstream RX_1 (which is not a dedicated clock data bitstream with a regular bit pattern), and the parallel data input RX IN2<M:1> is generated and output by the channel circuit 1302_2 in response to the single-ended RX bitstream RX_2 (which is not a dedicated clock data bitstream with a regular bit pattern).

In this embodiment, the post-processing circuit 1306 of each channel circuit implemented in the configurable IO interface circuit 126 includes the CDR circuit 1316. Hence, no single-ended clock data bitstream is received by the configurable IO interface circuit 126. Taking the channel circuit 1302_1 for example, the first input node N1 of the comparator 1308 is configured to receive the single-ended RX bitstream RX_1, and the second input node N2 of the comparator 1308 is configured to receive a reference voltage VREF that is an external voltage supplied to the die 108 (i.e., a voltage that is generated externally). The parallel data inputs RX IN1<M:1> and RX IN2<M:1> obtained by the configurable IO interface circuit 126 (which may be a part of an analog PHY component) are provided to the processing circuit 134 (particularly, a digital PHY component of the processing circuit 134) for further processing.

Since a person skilled in the pertinent art can readily understand details of applying the same RX configuration shown in FIG. 15 to other configurable IO interface circuits that are configured to perform single-ended intra-package (die-to-die) communication, similar description is omitted here for brevity.

Figure 16:
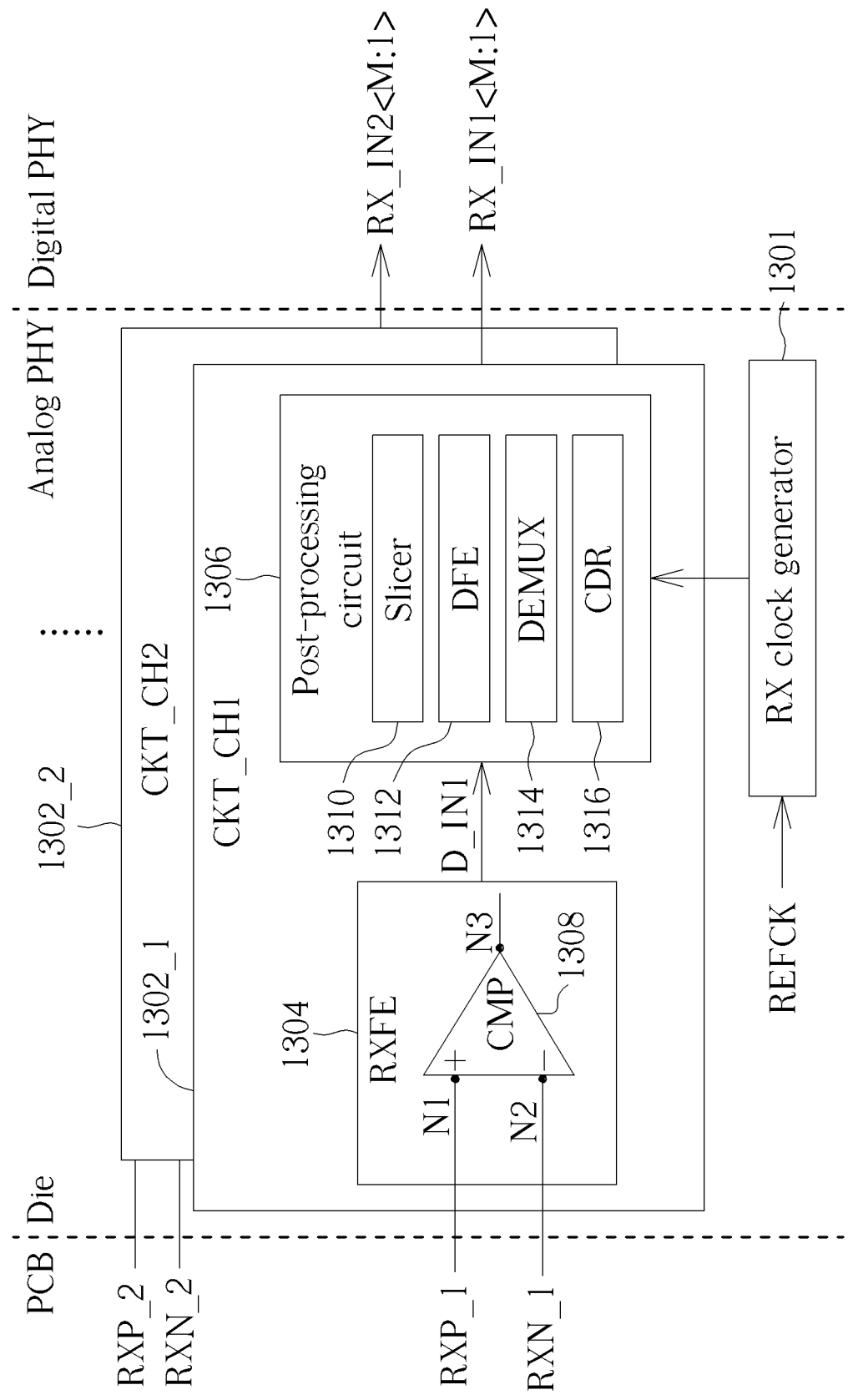
FIG. 16 is a diagram illustrating an embodiment of configuring the RX circuit shown in FIG. 13 as a part of a differential IO interface for inter-package (chip-to-chip) communication.

FIG. 16 is a diagram illustrating an embodiment of configuring the RX circuit 1300 as a part of a differential IO interface for inter-package (chip-to-chip) communication. When the same circuit design (which includes the RX design shown in FIG. 13) is employed by each of the configurable IO interface circuits 128 and 132, each of the configurable IO interface circuits 128 and 132 has the RX circuit 1300 configured for differential inter-package (chip-to-chip) communication. Taking the configurable IO interface circuit 128 for example, a differential RX bitstream consisting of a positive bitstream RXP_1 and a negative bitstream RXN_1 (which are transmitted via a portion of the PCB traces 124) is received by the channel circuit 1302_1, and another differential RX bitstream consisting of a positive bitstream RXP_2 and a negative bitstream RXN_2 (which are transmitted via a portion of the PCB traces 124) is received by the channel circuit 1302_2, such that the parallel data input RX IN1<M:1> is generated and output by the channel circuit 1302_1 in response to the differential RX bitstream (RXP_1, RXN_1), and the parallel data input RX IN2<M:1> is generated and output by the channel circuit 1302_2 in response to the differential RX bitstream (RXP_2, RXN_2), where none of the differential RX bitstreams (RXP_1, RXN_1) and (RXP_2, RXN_2) is a dedicated clock data bitstream with a regular bit pattern.

In this embodiment, the post-processing circuit 1306 of each channel circuit implemented in the configurable IO interface circuit 128 includes the CDR circuit 1316. Hence, no differential clock data bitstream is received by the configurable IO interface circuit 128. Taking the channel circuit 1302_1 for example, the first input node N1 of the comparator 1308 is configured to receive the positive RX bitstream RXP_1, and the second input node N2 of the comparator 1308 is configured to receive the negative RX bitstream RXN_1. The parallel data inputs RX IN1<M:1> and RX IN2<M:1> obtained by the configurable IO interface circuit 128 (which may be a part of an analog PHY component) are provided to the processing circuit 134 (particularly, a digital PHY component of the processing circuit 134) for further processing.

Since a person skilled in the pertinent art can readily understand details of applying the same RX configuration shown in FIG. 16 to other configurable IO interface circuits that are configured to perform differential inter-package (chip-to-chip) communication, similar description is omitted here for brevity.

As shown in FIGS. 14-16, the RX front-end circuit 1304 configured for single-ended intra-package (die-to-die) communication and the RX front-end circuit 1304 configured for differential inter-package (chip-to-chip) communication may have the same active circuit components. However, this is for illustrative purposes only, and is not meant to be a limitation of the present invention. Alternatively, the RX front-end circuit 1304 configured for single-ended intra-package (die-to-die) communication and the RX front-end circuit 1304 configured for differential inter-package (chip-to-chip) communication may not have the same active circuit components.

Figure 17:
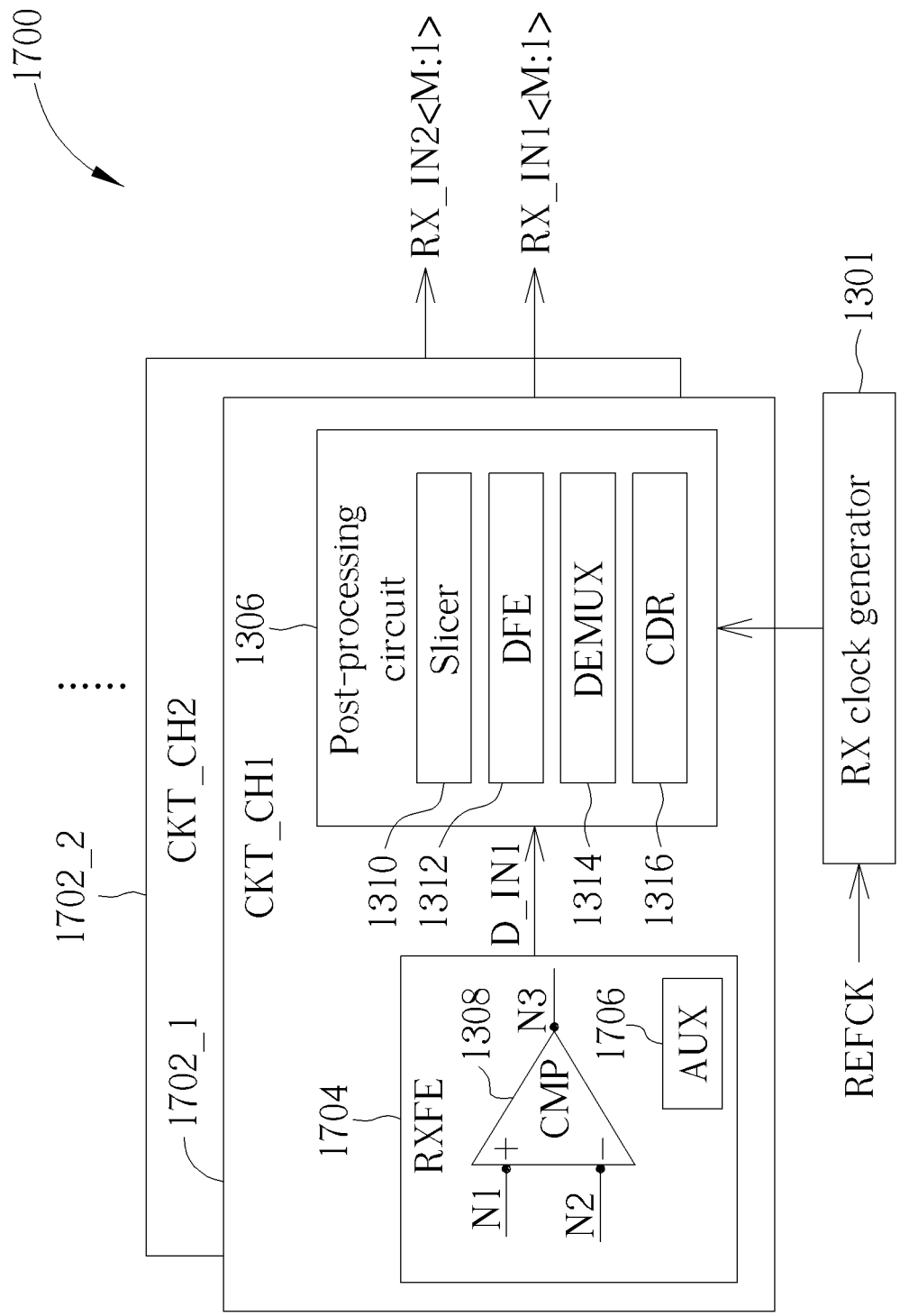
FIG. 17 is a diagram illustrating a second RX design that is a part of a circuit design employed by a configurable IO interface circuit according to an embodiment of the present invention.

FIG. 17 is a diagram illustrating a second RX design that is a part of a circuit design employed by a configurable IO interface circuit according to an embodiment of the present invention. The RX circuit 1700 includes a plurality of channel circuits (e.g., 1702_1 and 1702_2) and the aforementioned RX clock generator 1301. For brevity and simplicity, only two channel circuits are shown in FIG. 17. In practice, the number of channel circuits can be adjusted, depending upon the actual design considerations. All channel circuits implemented in the RX circuit 1700 may have the same circuit design. The major difference between the channel circuits 1302_1 and 1702_1 is that the RX front-end circuit 1704 is shown having an auxiliary circuit (labeled by "AUX") 1706. The auxiliary circuit 1706 is arranged to apply auxiliary processing to generation of the serial data input D_IN1 at the RX front-end circuit 1704. The auxiliary circuit 1706 may be disabled when the RX circuit 1700 belongs to a configurable IO interface circuit that is configured to perform one of single-ended intra-package (die-to-die) communication and differential inter-package (chip-to-chip) communication, and may be enabled when the RX circuit 1700 belongs to a configurable IO interface circuit that is configured to perform another of single-ended intra-package (die-to-die) communication and differential inter-package (chip-to-chip) communication. For example, the auxiliary circuit 1706 may be applied only when the comparator 1308 is under a single-ended RX operation. For another example, the auxiliary circuit 1706 may be applied only when the comparator 1308 is under a differential RX operation.

Figure 18:
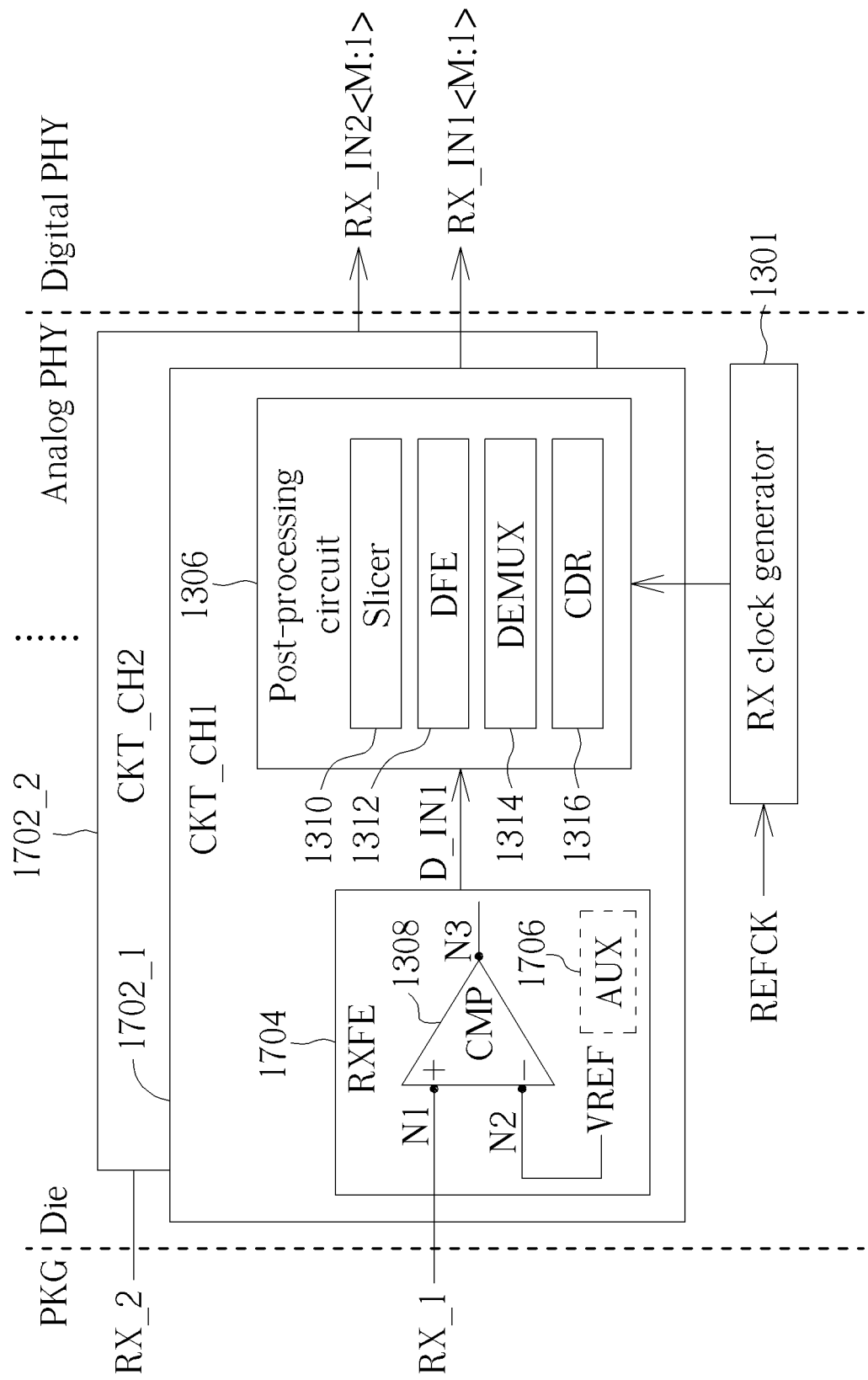
FIG. 18 is a diagram illustrating an embodiment of configuring the RX circuit shown in FIG. 17 as a part of a single-ended IO interface for intra-package (die-to-die) communication.

FIG. 18 is a diagram illustrating an embodiment of configuring the RX circuit 1700 as a part of a single-ended IO interface for intra-package (die-to-die) communication. When the same circuit design (which includes the RX design shown in FIG. 17) is employed by each of the configurable IO interface circuits 126 and 130, each of the configurable IO interface circuits 126 and 130 has the RX circuit 1700 configured for single-ended intra-package (die-to-die) communication. By way of example, but not limitation, it is assumed that the auxiliary circuit 1706 may be arranged to apply auxiliary processing to a comparator output at the output node N3 of the comparator 1308 when the comparator 1308 receives a differential RX bitstream. Since the RX circuit 1700 shown in FIG. 18 is configured for single-ended intra-package (die-to-die) communication, the auxiliary circuit 1706 of the RX front-end circuit 1704 is disabled (or powered off). By way of example, but not limitation, the RX front-end circuit 1304 configured for single-ended intra-package (die-to-die) communication as illustrated in FIG. 14 and the RX front-end circuit 1704 configured for single-ended intra-package (die-to-die) communication as illustrated in FIG. 18 may have the same active circuit components as well as the same data processing function.

Figure 19:
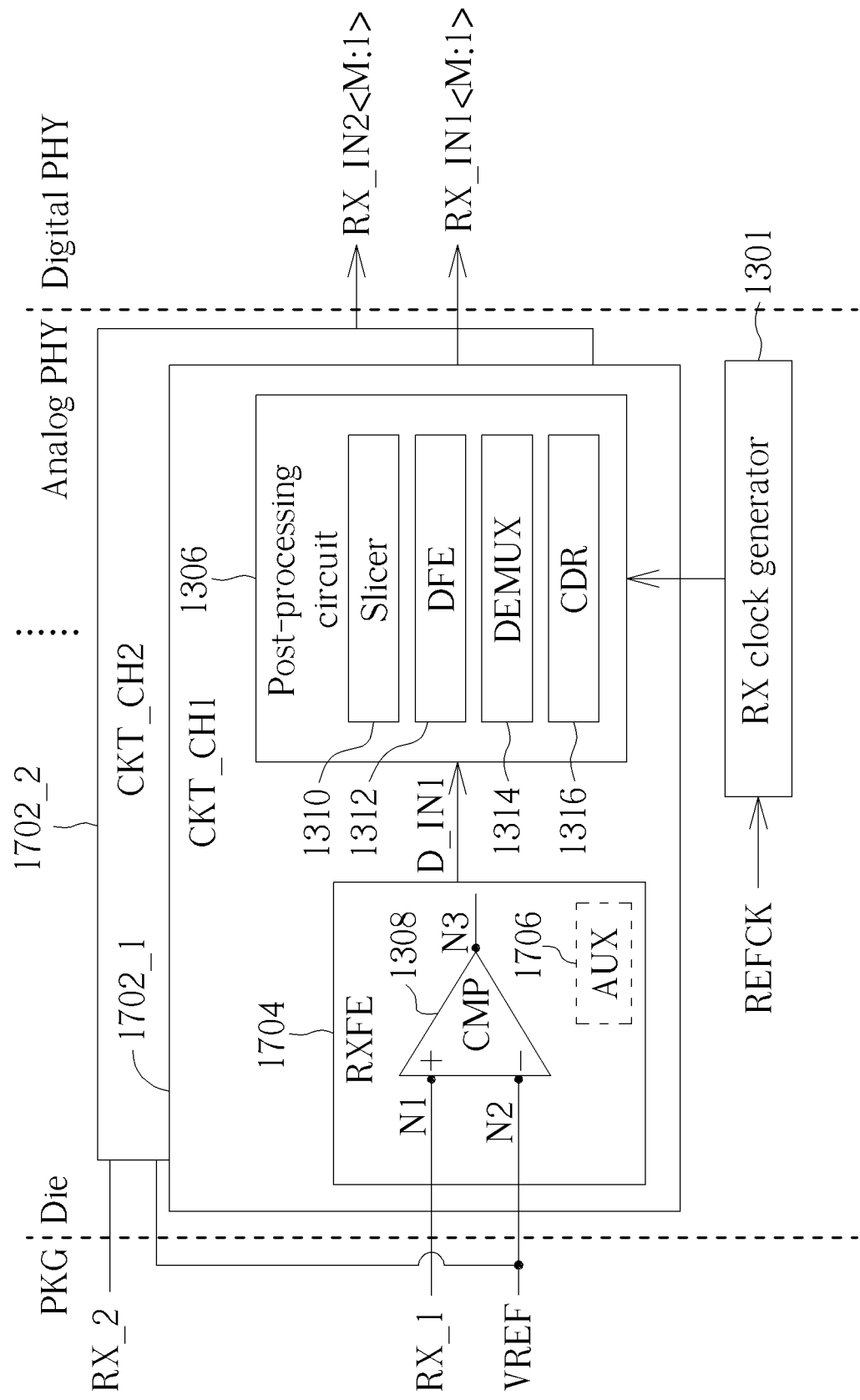
FIG. 19 is a diagram illustrating another embodiment of configuring the RX circuit shown in FIG. 17 as a part of a single-ended IO interface for intra-package (die-to-die) communication.

FIG. 19 is a diagram illustrating another embodiment of configuring the RX circuit 1700 as a part of a single-ended IO interface for intra-package (die-to-die) communication. When the same circuit design (which includes the RX design shown in FIG. 17) is employed by each of the configurable IO interface circuits 126 and 130, each of the configurable IO interface circuits 126 and 130 has the RX circuit 1700 configured for single-ended intra-package (die-to-die) communication. By way of example, but not limitation, it is assumed that the auxiliary circuit 1706 may be arranged to apply auxiliary processing to a comparator output at the output node N3 of the comparator 1308 when the comparator 1308 receives a differential RX bitstream. Since the RX circuit 1700 shown in FIG. is configured for single-ended intra-package (die-to-die) communication, the auxiliary circuit 1706 of the RX front-end circuit 1704 is disabled (or powered off). By way of example, but not limitation, the RX front-end circuit 1304 configured for single-ended intra-package (die-to-die) communication as illustrated in FIG. 15 and the RX front-end circuit 1704 configured for single-ended intra-package (die-to-die) communication as illustrated in FIG. 19 may have the same active circuit components as well as the same data processing function.

Figure 20:
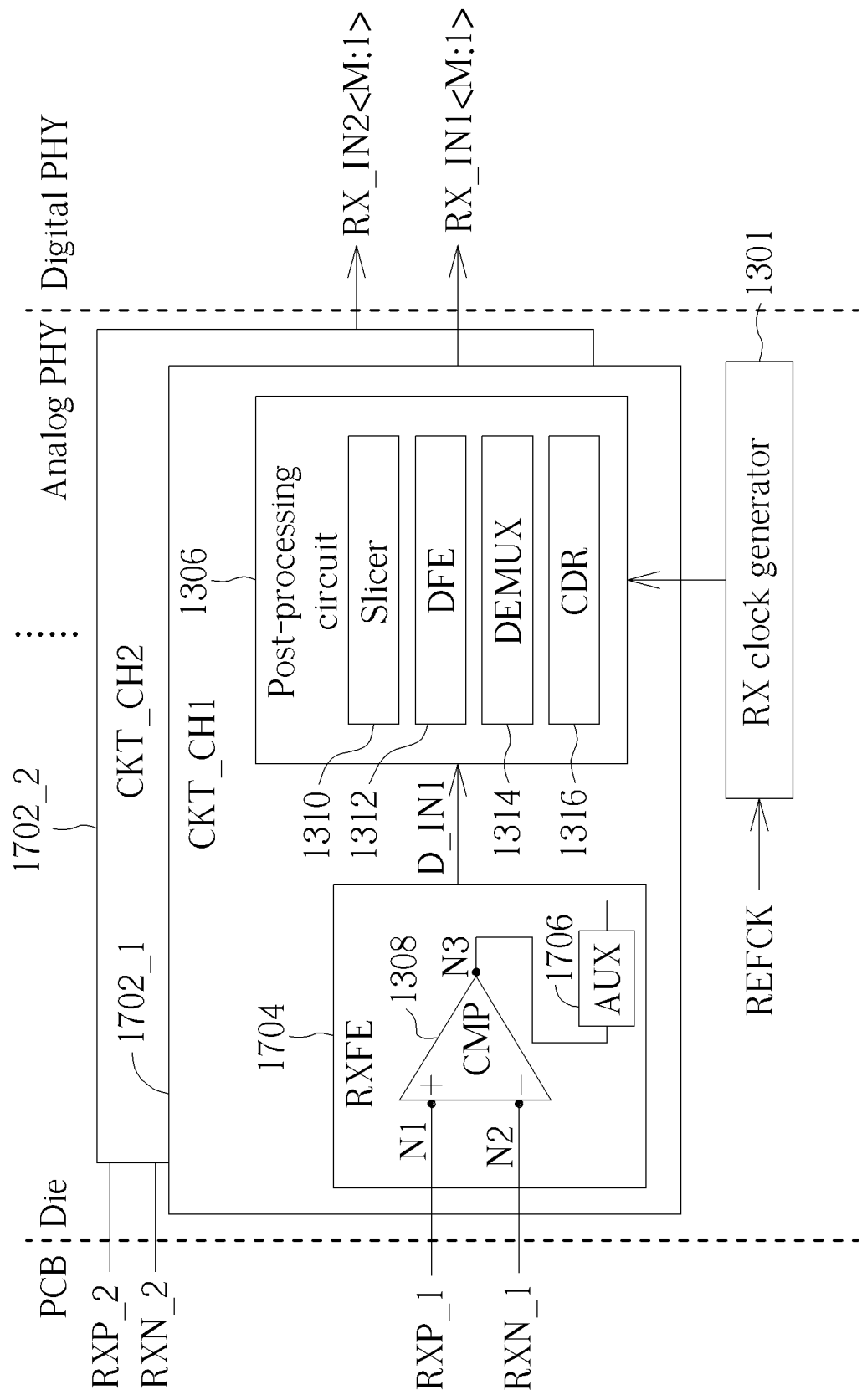
FIG. 20 is a diagram illustrating an embodiment of configuring the RX circuit shown in FIG. 17 as a part of a differential IO interface for inter-package (chip-to-chip) communication.

FIG. 20 is a diagram illustrating an embodiment of configuring the RX circuit 1700 as a part of a differential IO interface for inter-package (chip-to-chip) communication. When the same circuit design (which includes the RX design shown in FIG. 17) is employed by each of the configurable IO interface circuits 128 and 132, each of the configurable IO interface circuits 128 and 132 has the RX circuit 1700 configured for differential inter-package (chip-to-chip) communication. By way of example, but not limitation, it is assumed that the auxiliary circuit 1706 may be arranged to apply auxiliary processing to a comparator output at the output node N3 of the comparator 1308 when the comparator 1308 receives a differential RX bitstream. Since the RX circuit 1700 shown in FIG. 20 is configured for differential inter-package (chip-to-chip) communication, the auxiliary circuit 1706 of the RX front-end circuit 1704 is enabled. It should be noted that the RX front-end circuit 1704 configured for single-ended intra-package (die-to-die) communication as illustrated in FIGS. 18 and 19 and the RX front-end circuit 1704 configured for differential inter-package (chip-to-chip) communication as illustrated in FIG. 20 may have different active circuit component arrangements as well as different data processing functions. By way of example, but not limitation, the RX front-end circuit 1704 configured for differential inter-package (chip-to-chip) communication as illustrated in FIG. 20 and the RX front-end circuit 1304 configured for differential inter-package (chip-to-chip) communication as illustrated in FIG. 16 may have the same data processing function except the auxiliary processing function provided by the auxiliary circuit 1706.

Regarding the RX design 1300 shown in FIG. 13, the clock and data recovery circuit 1316 is implemented, such that no clock data is needed to be transmitted from a TX circuit to an RX circuit. Hence, no single-ended clock data bitstream is received by a configurable IO interface circuit with an RX design shown in any of FIGS. 14-15 and FIGS. 18-19, and no differential clock data bitstream is received by a configurable IO interface circuit with an RX design shown in any of FIG. 16 and FIG. 20. In some embodiments, clock forwarding scheme may be employed by a TX circuit, and a CDR circuit may be removed from an RX circuit for power saving. Hence, under a condition that CDR-less RX circuits are implemented in SERDES IO interfaces, a dedicated single-ended clock data bitstream (which has a regular bit pattern indicative of the clock information) is needed to be transmitted from a TX circuit to an RX circuit via intra-package traces, and a dedicated differential clock data bitstream (which has a regular bit pattern indicative of the clock information) is needed to be transmitted from a TX circuit to an RX circuit via inter-package traces.

Figure 21:
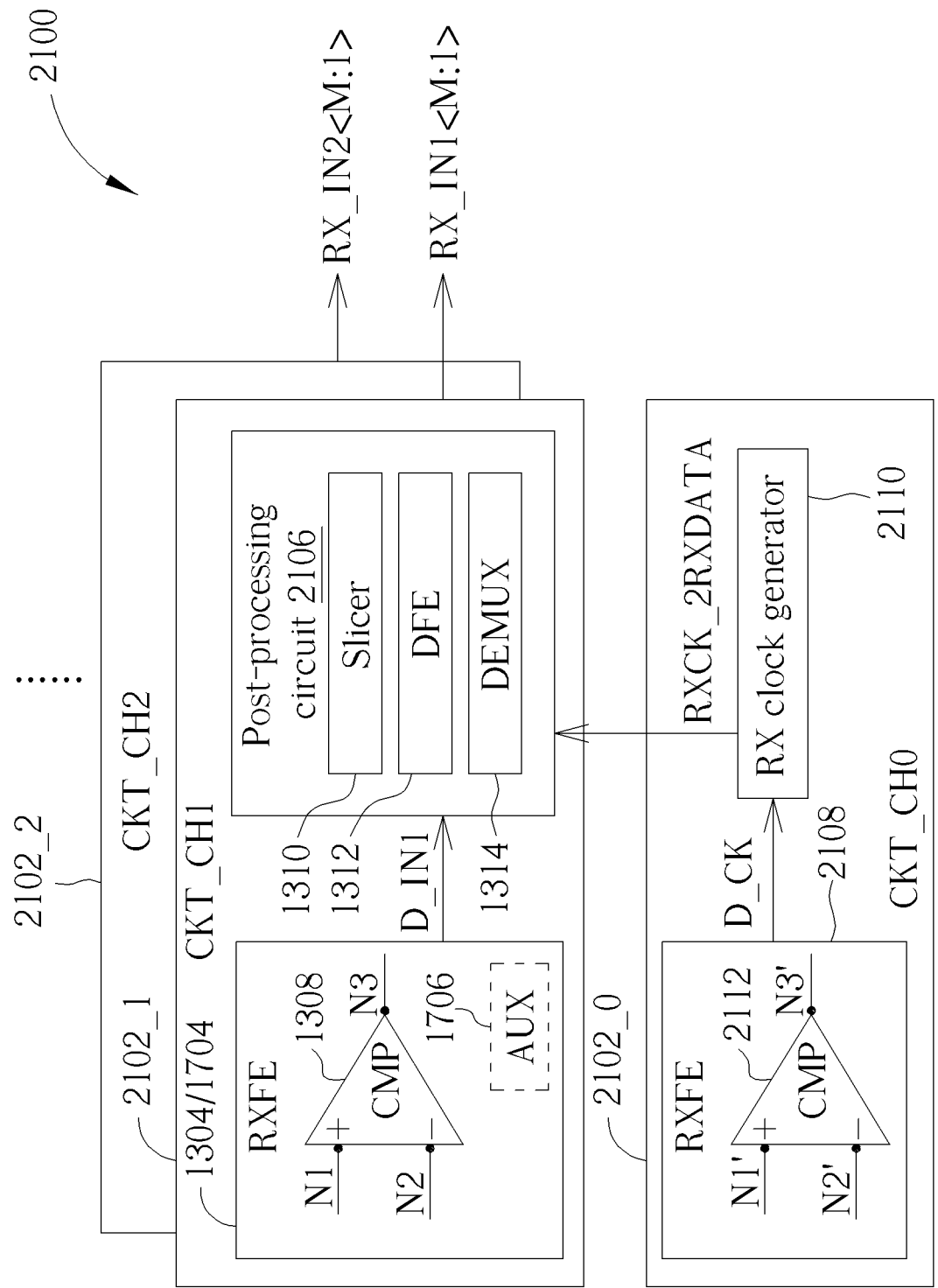
FIG. 21 is a diagram illustrating a third RX design that is a part of a circuit design employed by a configurable IO interface circuit according to an embodiment of the present invention.

FIG. 21 is a diagram illustrating a third RX design that is a part of a circuit design employed by a configurable IO interface circuit according to an embodiment of the present invention. The RX circuit 2100 includes a clock data channel circuit 2102_0, and a plurality of non-clock data channel circuits (e.g., 2102_1 and 2102_2). For brevity and simplicity, only two non-clock data channel circuits are shown in FIG. 21. In practice, the number of non-clock data channel circuits can be adjusted, depending upon the actual design considerations. All non-clock data channel circuits implemented in the RX circuit 2100 may have the same circuit design. As shown in FIG. 21, the clock data channel circuit (labeled by "CKT_CH0") 2102_0 includes an RX front-end circuit (labeled by "RXFE") 2108 and an RX clock generator 2110, and the non-clock data channel circuit (labeled by "CKT_CH1") 2102_1 includes a post-processing circuit 2106 and the aforementioned RX front-end circuit (labeled by "RXFE") 1304 (or 1704). It should be noted that, if the RX front-end circuit 1304 is used by the non-clock data channel circuit 2102_1 of the present invention, there is no auxiliary circuit 1706, and if the RX front-end circuit 1704 is used by the non-clock data channel circuit 2102_1 of the present invention, the auxiliary circuit 1706 may be selectively enabled or disabled, depending upon a configuration of a configurable IO interface circuit.

Regarding the clock data channel circuit 2102_0, the RX front-end circuit 2108 includes a comparator circuit (labeled by "CMP") 2112 that has a first input node N1', a second input node N2', and an output node N3', wherein a serial data input D_CK is a clock data input generated from the RX front-end circuit 2108, and is derived from a comparator output at the output node N3'. The RX clock generator 2110 of the clock data channel circuit 2102_0 is arranged to generate an RX data clock RXCK_2RXDATA required by normal operations of internal components of the non-clock data channel circuits 2102_1 and 2102_2 according to the serial data input D_CK.

Regarding the non-clock data channel circuit 2102_1, the RX front-end circuit 1304/1704 is arranged to generate a serial data input D_IN1, and the post-processing circuit 2106 is arranged to generate and output a parallel data input RX IN1<M:1> according to the serial data input D_IN1. The post-processing circuit 2106 may include one or more post-processing blocks, such as a slicer 1310, a decision feedback equalizer (DFE) 1312, and/or a demultiplexer (DEMUX) 1314. It should be note that no clock and data recovery circuit is implemented in the post-processing circuit 2106. Since the non-clock data channel circuits 2102_1 and 2102_2 have the same circuit design, a parallel data input RX IN2<M:1> is output from the non-clock data channel circuit 2102_2.

When the circuit design (which includes the RX design shown in FIG. 21) is employed by any of the configurable IO interface circuits, the RX circuit 2100 is configured to act as a part of a single-ended IO interface for intra-package (die-to-die) communication or a part of a differential IO interface for inter-package (chip-to-chip) communication.

Figure 22:
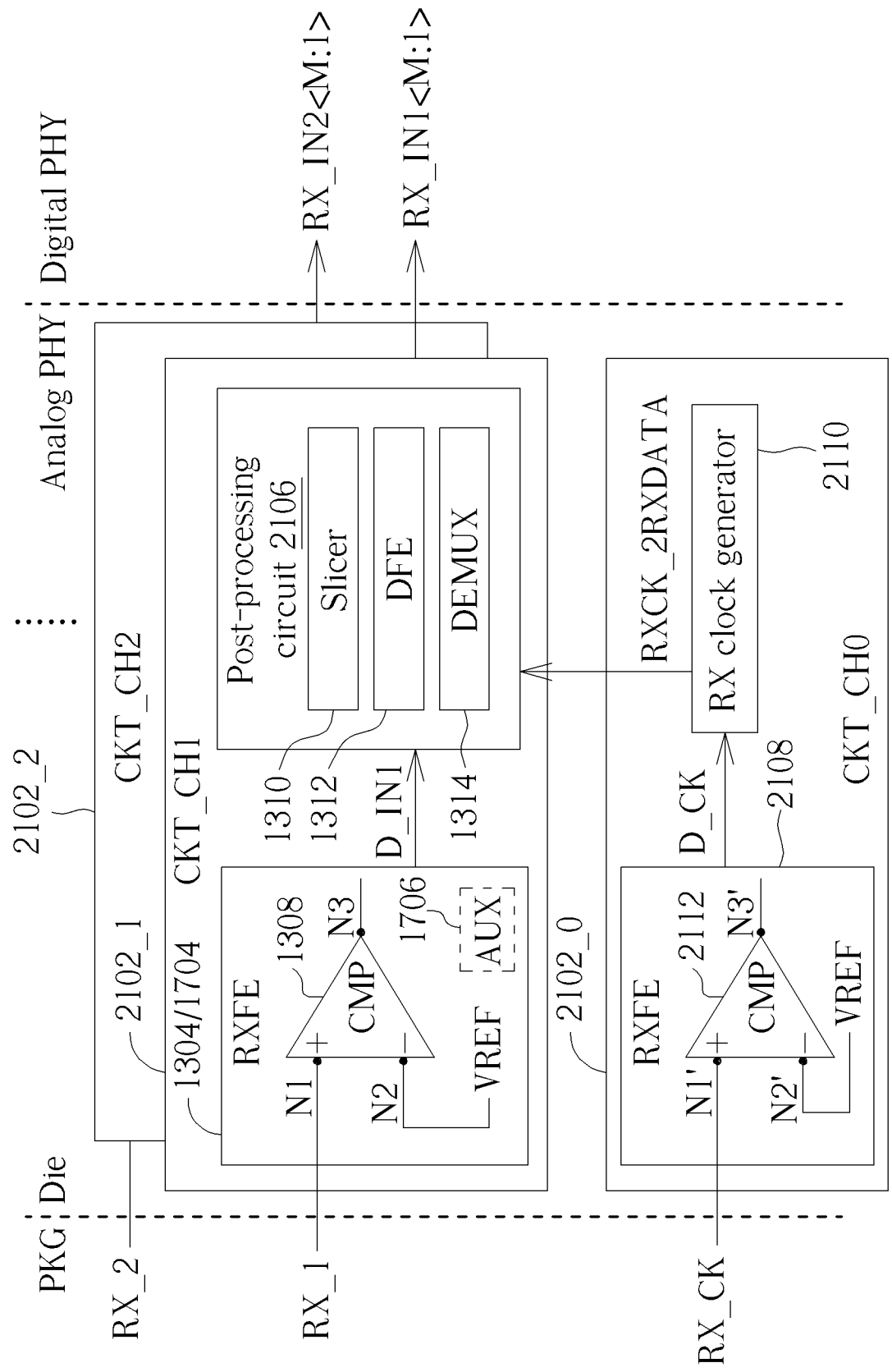
FIG. 22 is a diagram illustrating an embodiment of configuring the RX circuit shown in FIG. 21 as a part of a single-ended IO interface for intra-package (die-to-die) communication.

FIG. 22 is a diagram illustrating an embodiment of configuring the RX circuit 2100 as a part of a single-ended IO interface for intra-package (die-to-die) communication. When the same circuit design (which includes the RX design shown in FIG. 21) is employed by each of the configurable IO interface circuits 126 and 130, each of the configurable IO interface circuits 126 and 130 has the RX circuit 2100 configured for single-ended intra-package (die-to-die) communication. Taking the configurable IO interface circuit 126 for example, the post-processing circuit 2106 of each non-clock data channel circuit has no CDR circuit, and a single-ended clock data bitstream transmitted via a portion of PKG traces 122 is received by the configurable IO interface circuit 126 (particularly, the clock data channel circuit 2102_0). More specifically, the first input node N1' of the comparator 2112 is configured to receive a single-ended RX bitstream RX_CK that is the single-ended clock data bitstream, and the second input node N2' of the comparator 2112 is configured to receive a reference voltage VREF that is an internal voltage of the die 108 (i.e., a voltage that is generated internally or inherently). The RX front-end circuit 2108 derives the serial data input D_CK from a comparator output at the output node N3', and the RX clock generator 2110 generates the RX data clock RXCK_2RXDATA according to the serial data input D_CK and provides the RX data clock RXCK_2RXDATA to each of the non-clock data channel circuits 2102_1 and 2102_2. The parallel data inputs RX IN1<M:1> and RX IN2<M:1> obtained at the configurable IO interface circuit 126 (which may be a part of an analog PHY component) are provided to the processing circuit 134 (particularly, a digital PHY component of the processing circuit 134) for further processing.

Since a person skilled in the pertinent art can readily understand details of applying the same RX configuration shown in FIG. 22 to other configurable IO interface circuits that are configured to perform single-ended intra-package (die-to-die) communication, similar description is omitted here for brevity.

Figure 23:
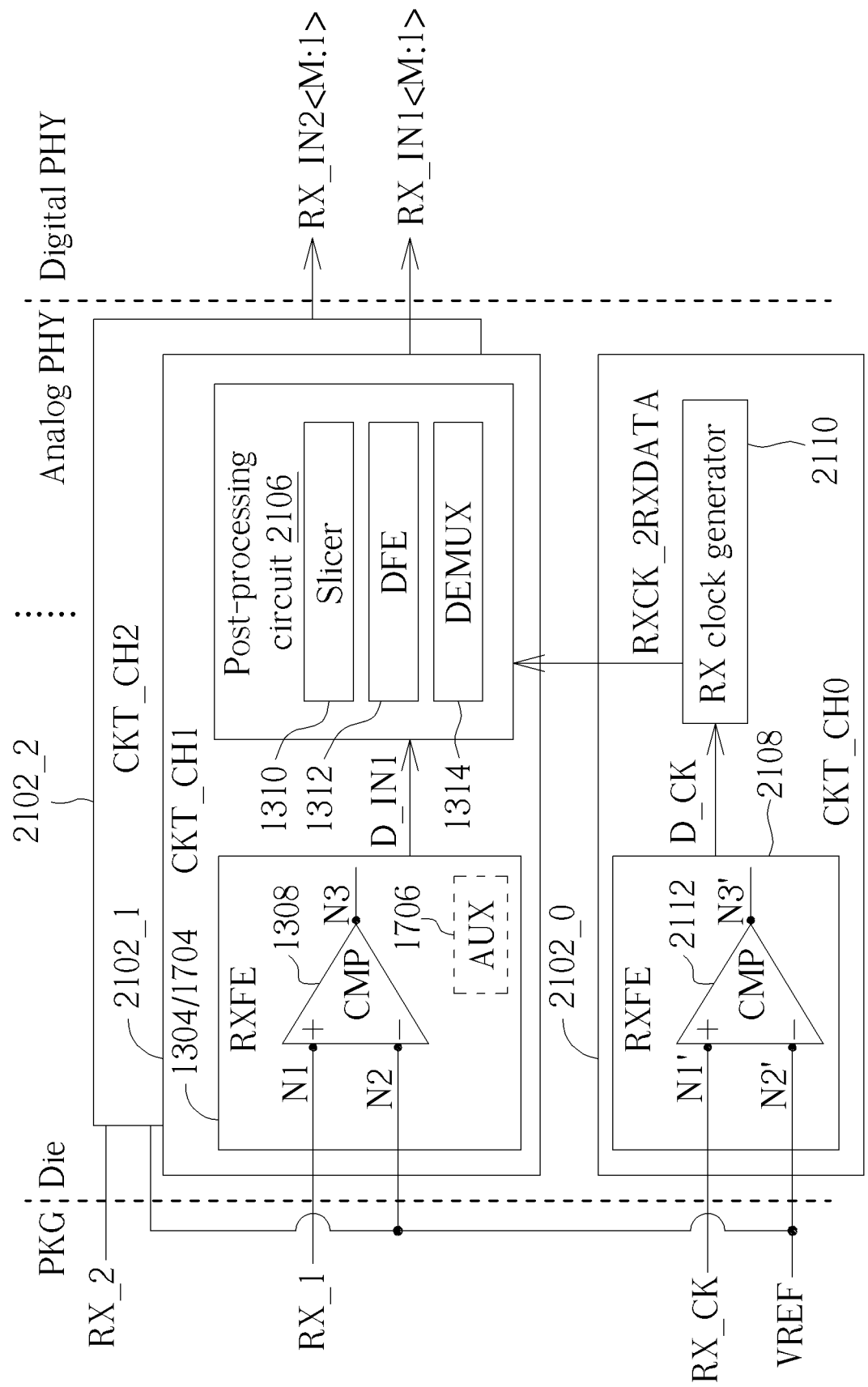
FIG. 23 is a diagram illustrating another embodiment of configuring the RX circuit shown in FIG. 21 as a part of a single-ended IO interface for intra-package (die-to-die) communication.

FIG. 23 is a diagram illustrating another embodiment of configuring the RX circuit 2100 as a part of a single-ended IO interface for intra-package (die-to-die) communication. When the same circuit design (which includes the RX design shown in FIG. 21) is employed by each of the configurable IO interface circuits 126 and 130, each of the configurable IO interface circuits 126 and 130 has the RX circuit 2100 configured for single-ended intra-package (die-to-die) communication. Taking the configurable IO interface circuit 126 for example, the post-processing circuit 2106 of each non-clock data channel circuit has no CDR circuit, and a single-ended clock data bitstream transmitted via a portion of PKG traces 122 is received by the configurable IO interface circuit 126 (particularly, the clock data channel circuit 2102_0). More specifically, the first input node N1' of the comparator 2112 is configured to receive a single-ended RX bitstream RX_CK that is the single-ended clock data bitstream, and the second input node N2' of the comparator 2112 is configured to receive a reference voltage VREF that is an external voltage supplied to the die 108 (i.e., a voltage that is generated externally). The RX front-end circuit 2108 derives the serial data input D_CK from a comparator output at the output node N3', and the RX clock generator 2110 generates the RX data clock RXCK_2RXDATA according to the serial data input D_CK and provides the RX data clock RXCK_2RXDATA to each of the non-clock data channel circuits 2102_1 and 2102_2. The parallel data inputs RX IN1<M:1> and RX IN2<M:1> obtained by the configurable IO interface circuit 126 (which may be a part of an analog PHY component) are provided to the processing circuit 134 (particularly, a digital PHY component of the processing circuit 134) for further processing.

Since a person skilled in the pertinent art can readily understand details of applying the same RX configuration shown in FIG. 23 to other configurable IO interface circuits that are configured to perform single-ended intra-package (die-to-die) communication, similar description is omitted here for brevity.

Figure 24:
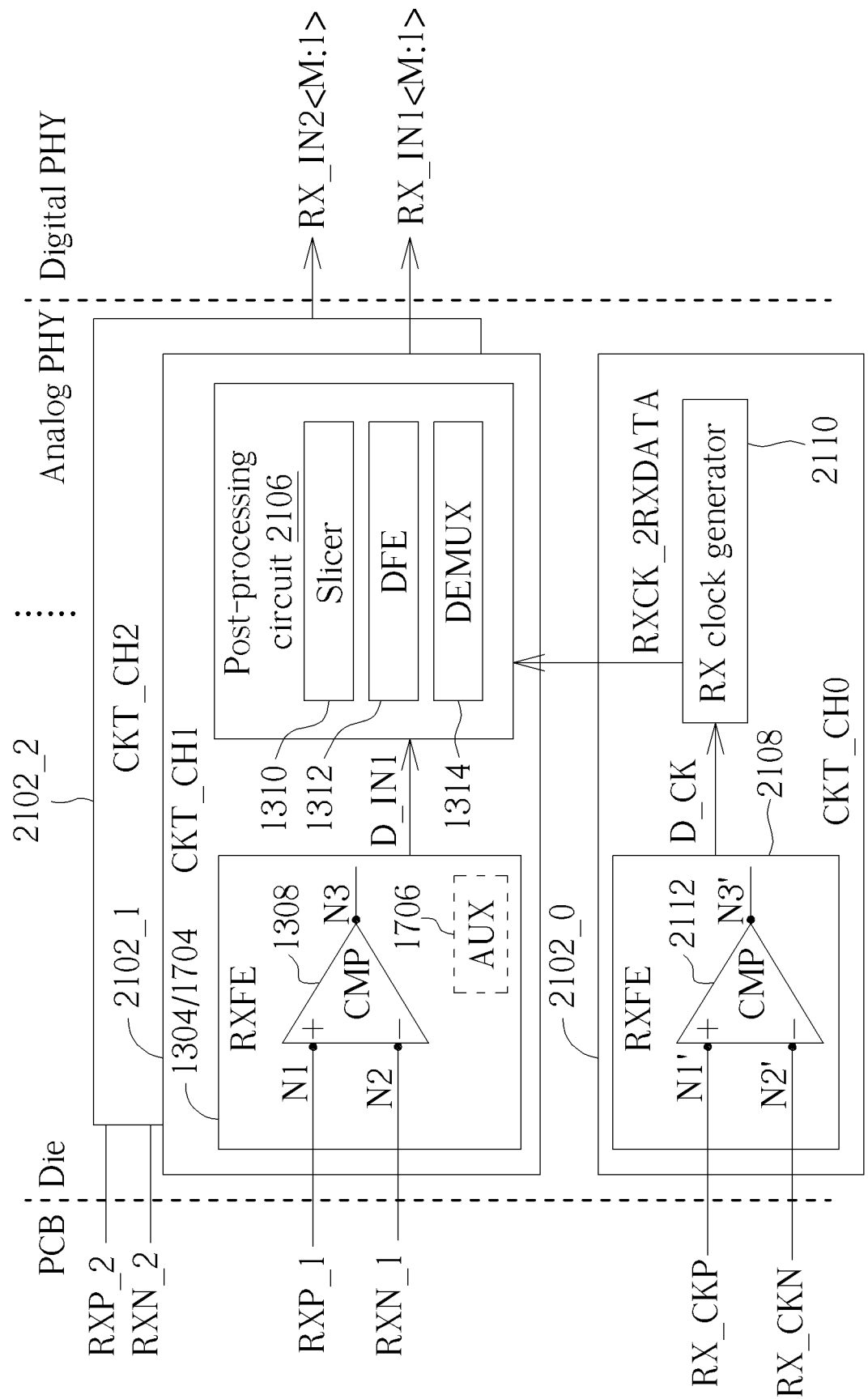
FIG. 24 is a diagram illustrating an embodiment of configuring the RX circuit shown in FIG. 21 as a part of a differential IO interface for inter-package (chip-to-chip) communication.

FIG. 24 is a diagram illustrating an embodiment of configuring the RX circuit 2100 as a part of a differential IO interface for inter-package (chip-to-chip) communication. When the same circuit design (which includes the RX design shown in FIG. 21) is employed by each of the configurable IO interface circuits 128 and 132, each of the configurable IO interface circuits 128 and 132 has the RX circuit 2100 configured for differential inter-package (chip-to-chip) communication. Taking the configurable IO interface circuit 128 for example, the post-processing circuit 2106 of each non-clock data channel circuit has no CDR circuit, and a differential clock data bitstream transmitted via a portion of PCB traces 124 is received by the configurable IO interface circuit 128 (particularly, the clock data channel circuit 2102_0). The clock data channel circuit 2102_0 is configured to receive a differential RX bitstream that is the differential clock data bitstream, where the differential RX bitstream consists of a positive RX bitstream RX_CKP and a negative RX bitstream RX_CKN. More specifically, the first input node N1' of the comparator 2112 is configured to receive the positive RX bitstream RX_CKP, and the second input node N2' of the comparator 2112 is configured to receive the negative RX bitstream RX_CKN. The RX front-end circuit 2108 derives the serial data input D_CK from a comparator output at the output node N3', and the RX clock generator 2110 generates the RX data clock RXCK_2RXDATA according to the serial data input D_CK and provides the RX data clock RXCK_2RXDATA to each of the non-clock data channel circuits 2102_1 and 2102_2. The parallel data inputs RX IN1<M:1> and RX IN2<M:1> obtained by the configurable IO interface circuit 126 (which may be apart of an analog PHY component) are provided to the processing circuit 134 (particularly, a digital PHY component of the processing circuit 134) for further processing.

Since a person skilled in the pertinent art can readily understand details of applying the same RX configuration shown in FIG. 24 to other configurable IO interface circuits that are configured to perform differential inter-package (chip-to-chip) communication, similar description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-package system comprising:
   a first semiconductor package, comprising:
   a first die, comprising:
   a first processing circuit, arranged to perform designated functions;
   a first configurable input/output (TO) interface circuit; and
   a second configurable IO interface circuit;
   a second die, comprising:
   a second processing circuit, arranged to perform designated functions; and
   a third configurable IO interface circuit, coupled to the first configurable IO circuit via intra-package traces; and
   a second semiconductor package, comprising:
   a third die, comprising:
   a third processing circuit, arranged to perform designated functions; and
   a fourth configurable IO interface circuit, coupled to the second configurable IO interface circuit via inter-package traces;
   wherein the first processing circuit communicates with the second processing circuit through the first configurable IO interface circuit and the third configurable IO interface circuit that are configured to perform single-ended intra-package communication; the first processing circuit communicates with the third processing circuit through the second configurable IO interface circuit and the fourth configurable IO interface circuit that are configured to perform differential inter-package communication; and the first configurable IO interface circuit and the second configurable IO interface circuit have a same circuit design.

2. The multi-package system of claim 1, wherein said same circuit design comprises:
   a first channel circuit, comprising:
   a first multiplexer, arranged to multiplex a first parallel data input obtained from the first processing circuit to generate a first serial data output; and
   a first driving circuit, arranged to generate a first transmit (TX) bitstream according to the first serial data output; and
   a second channel circuit, comprising:
   a second multiplexer, arranged to multiplex a second parallel data input obtained from the first processing circuit to generate a second serial data output; and
   a second driving circuit, arranged to generate a second TX bitstream according to the second serial data output;
   wherein regarding the first configurable TO interface circuit, the first parallel data input and the second parallel data input obtained from the first processing circuit are single-ended data inputs, respectively; and
   wherein regarding the second configurable TO interface circuit, the first parallel data input and the second parallel data input obtained from the first processing circuit form a differential data input.

3. The multi-package system of claim 2, wherein regarding the first configurable TO interface circuit, no single-ended clock data input is received for transmission.

4. The multi-package system of claim 2, wherein regarding the second configurable TO interface circuit, no differential clock data input is received for transmission.

5. The multi-package system of claim 2, wherein regarding the first configurable TO interface circuit, one of the single-ended data inputs is a single-ended clock data input.

6. The multi-package system of claim 2, wherein regarding the second configurable IO interface circuit, the differential data input is a differential clock data input.

7. The multi-package system of claim 1, wherein said same circuit design comprises:
   a multiplexer, arranged to multiplex a parallel data input obtained from the first processing circuit to generate a serial data output, wherein the parallel data input is a single-ended data input; and
   a first driving circuit, arranged to generate a first transmit (TX) bitstream according to the serial data output, wherein the first driving circuit comprises an auxiliary processing circuit arranged to generate a second TX bitstream according to the serial data output, where the second TX bitstream is an inverse version of the first TX bitstream;

wherein regarding the first configurable IO interface circuit, the second TX bitstream is not output to any of the intra-package traces; and wherein regarding the second configurable IO interface circuit, the first TX bitstream and the second TX bitstream that form a differential TX bitstream are output to at least a portion of the inter-package traces.

8. The multi-package system of claim 7, wherein regarding the first configurable IO interface circuit, no single-ended clock data input is received for transmission.

9. The multi-package system of claim 7, wherein regarding the second configurable IO interface circuit, no differential clock data input is received for transmission.

10. The multi-package system of claim 7, wherein regarding the first configurable IO interface circuit, the parallel data input is a single-ended clock data input.

11. The multi-package system of claim 7, wherein regarding the second configurable TO interface circuit, the parallel data input is a differential clock data input.

12. The multi-package system of claim 1, wherein said same circuit design comprises:
a receive (RX) front-end circuit, comprising:
a comparator circuit, having a first input node, a second input node, and an output node, wherein a serial data input generated from the RX front-end circuit is derived from a comparator output at the output node;
wherein regarding the first configurable TO interface circuit, the first input node of the comparator is configured to receive a single-ended RX bitstream, and the second input node of the comparator is configured to receive a reference voltage; and
wherein regarding the second configurable TO interface circuit, the first input node of the comparator is configured to receive a first RX bitstream, and the second input node of the comparator is configured to receive a second RX bitstream, where the first RX bitstream and the second RX bitstream form a differential RX bitstream.

13. The multi-package system of claim 12, wherein the reference voltage is an internal voltage of the first die.

14. The multi-package system of claim 12, wherein the reference voltage is an external voltage supplied to the first die.

15. The multi-package system of claim 12, wherein the RX front-end circuit further comprises an auxiliary processing circuit arranged to apply auxiliary processing to generation of the serial data input, one of the first configurable TO interface circuit and the second configurable TO interface circuit is configured to enable the auxiliary processing circuit, and another of the first configurable TO interface circuit and the second configurable TO interface circuit is configured to disable the auxiliary processing circuit.

16. The multi-package system of claim 12, wherein said same circuit design further comprises:
a post-processing circuit, arranged to generate and output a parallel data input according to the serial data input, wherein the post-processing circuit comprises a clock and data recovery (CDR) circuit, and regarding the first configurable TO interface circuit, no single-ended clock data stream is received.

17. The multi-package system of claim 12, wherein said same circuit design further comprises:
a post-processing circuit, arranged to generate and output a parallel data input according to the serial data input, wherein the post-processing circuit comprises a clock and data recovery (CDR) circuit, and regarding the second configurable TO interface circuit, no differential clock data stream is received.

18. The multi-package system of claim 12, wherein regarding the first configurable TO interface circuit, the single-ended RX bitstream is a single-ended clock data stream; and said same circuit design further comprises:
a clock generation circuit, arranged to generate an RX clock according to the serial data input generated from the RX front-end circuit.

19. The multi-package system of claim 12, wherein regarding the second configurable TO interface circuit, the differential RX bitstream is a differential clock data stream; and said same circuit design further comprises:
a clock generation circuit, arranged to generate an RX clock according to the serial data input generated from the RX front-end circuit.

20. A die packaged in a semiconductor package comprising:
a processing circuit, arranged to perform designated functions; and
a configurable input/output (TO) interface circuit, wherein when the configurable TO interface circuit is coupled to another die in the semiconductor package via intra-package traces, the configurable TO interface circuit is configured to provide single-ended intra-package communication for the processing circuit;
and when the configurable TO interface circuit is coupled to another die in another semiconductor package via inter-package traces, the configurable TO interface circuit is configured to provide differential inter-package communication for the processing circuit;
wherein the processing circuit and the configurable TO interface circuit are both included in the same die, the single-ended intra-package communication is between two dies in the same semiconductor package, and the differential inter-package communication is between two dies in different semiconductor packages.

* * * * *